United States Patent
Wiegand et al.

(10) Patent No.: US 10,418,415 B2
(45) Date of Patent: Sep. 17, 2019

(54) INTERCONNECT CAPPING PROCESS FOR INTEGRATION OF MRAM DEVICES AND THE RESULTING STRUCTURES

(71) Applicant: Intel Corporation, Santa Clara, CA (US)

(72) Inventors: Christopher J. Wiegand, Portland, OR (US); Oleg Golonzka, Beaverton, OR (US); MD Tofizur Rahman, Portland, OR (US); Brian S. Doyle, Portland, OR (US); Mark L. Doczy, Beaverton, OR (US); Kevin P. O'Brien, Portland, OR (US); Kaan Oguz, Beaverton, OR (US); Tahir Ghani, Portland, OR (US); Satyarth Suri, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/069,165

(22) PCT Filed: Mar. 28, 2016

(86) PCT No.: PCT/US2016/024555
§ 371 (c)(1),
(2) Date: Jul. 10, 2018

(87) PCT Pub. No.: WO2017/171716
PCT Pub. Date: Oct. 5, 2017

(65) Prior Publication Data
US 2019/0027537 A1    Jan. 24, 2019

(51) Int. Cl.
*H01L 27/22* (2006.01)
*H01L 43/02* (2006.01)
(Continued)

(52) U.S. Cl.
CPC .......... *H01L 27/228* (2013.01); *G11C 11/161* (2013.01); *H01F 10/329* (2013.01);
(Continued)

(58) Field of Classification Search
CPC ........ H01L 27/228; H01L 24/01; H01L 43/02
See application file for complete search history.

(56) References Cited

U.S. PATENT DOCUMENTS

| | | | |
|---|---|---|---|
| 8,143,157 B2 * | 3/2012 | Torres | H01L 21/7682 257/751 |
| 8,274,155 B2 * | 9/2012 | Usami | H01L 21/7682 257/773 |

(Continued)

FOREIGN PATENT DOCUMENTS

JP    2005-101071    4/2005

OTHER PUBLICATIONS

International Search Report and Written Opinion for International Patent Application No. PCT/US2016/024555 dated Dec. 14, 2016, 10pgs.

(Continued)

*Primary Examiner* — William Coleman
(74) *Attorney, Agent, or Firm* — Schwabe, Williamson & Wyatt, P.C.

(57) ABSTRACT

Approaches for an interconnect cladding process for integrating magnetic random access memory (MRAM) devices, and the resulting structures, are described. In an example, a memory structure includes an interconnect disposed in a trench of a dielectric layer above a substrate, the interconnect including a diffusion barrier layer disposed at a bottom of and along sidewalls of the trench to an uppermost surface of the dielectric layer, a conductive fill layer disposed on the diffusion barrier layer and recessed below the uppermost surface of the dielectric layer and an uppermost surface of (Continued)

the diffusion barrier layer, and a conductive capping layer disposed on the conductive fill layer and between sidewall portions of the diffusion barrier layer. A memory element is disposed on the conductive capping layer of the interconnect.

24 Claims, 14 Drawing Sheets

(51) Int. Cl.
| | |
|---|---|
| *H01L 43/10* | (2006.01) |
| *H01L 43/12* | (2006.01) |
| *G11C 11/16* | (2006.01) |
| *H01F 10/32* | (2006.01) |
| *H01F 41/32* | (2006.01) |
| *H01L 21/768* | (2006.01) |
| *H01L 23/528* | (2006.01) |
| *H01L 23/532* | (2006.01) |
| *H01L 21/027* | (2006.01) |
| *H01L 21/311* | (2006.01) |
| *H01L 21/321* | (2006.01) |
| *H01L 21/3213* | (2006.01) |

(52) U.S. Cl.
CPC ......... *H01F 10/3254* (2013.01); *H01F 41/32* (2013.01); *H01L 21/7685* (2013.01); *H01L 21/76802* (2013.01); *H01L 21/76843* (2013.01); *H01L 21/76877* (2013.01); *H01L 23/528* (2013.01); *H01L 23/53238* (2013.01); *H01L 27/226* (2013.01); *H01L 43/02* (2013.01); *H01L 43/10* (2013.01); *H01L 43/12* (2013.01); *H01L 21/0273* (2013.01); *H01L 21/31116* (2013.01); *H01L 21/31144* (2013.01); *H01L 21/3212* (2013.01); *H01L 21/32134* (2013.01); *H01L 21/7684* (2013.01)

(56) References Cited

U.S. PATENT DOCUMENTS

| | | |
|---|---|---|
| 8,415,261 B1 | 4/2013 | Reid et al. |
| 2004/0160810 A1 | 8/2004 | Deak et al. |
| 2005/0276099 A1 | 12/2005 | Horng et al. |
| 2006/0019487 A1* | 1/2006 | Leuschner ............ G11C 11/16 438/637 |

OTHER PUBLICATIONS

International Preliminary Report on Patentability for International Patent Application No. PCT/US2016/024555 dated Oct. 11, 2018, 7 pages.

* cited by examiner

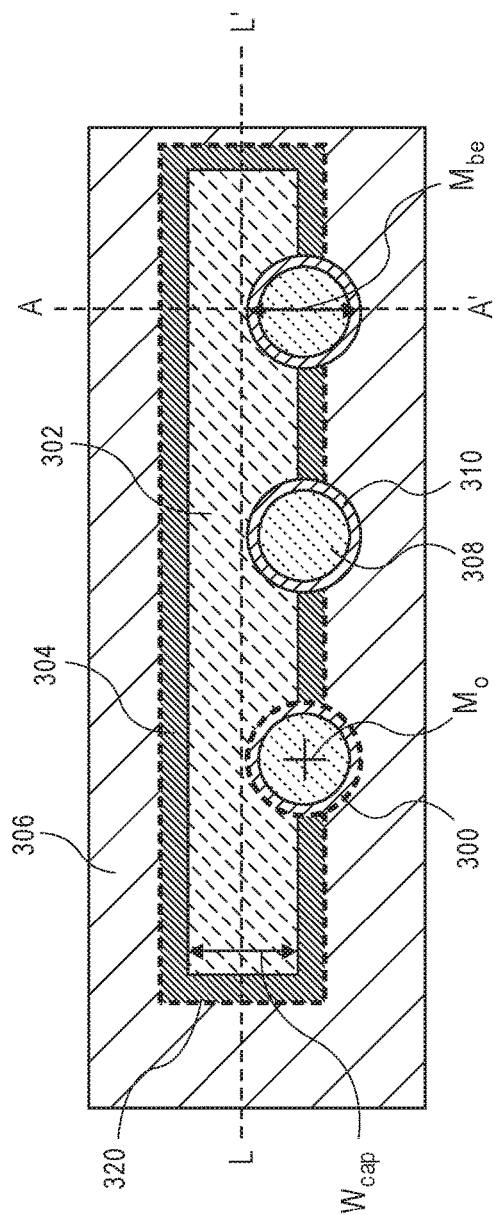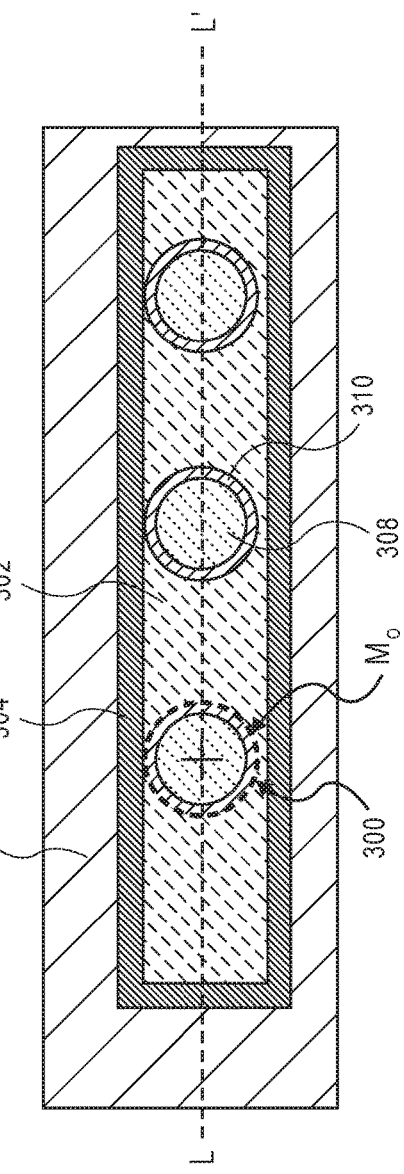

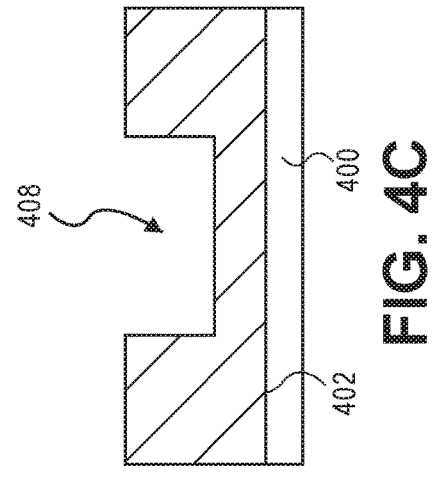
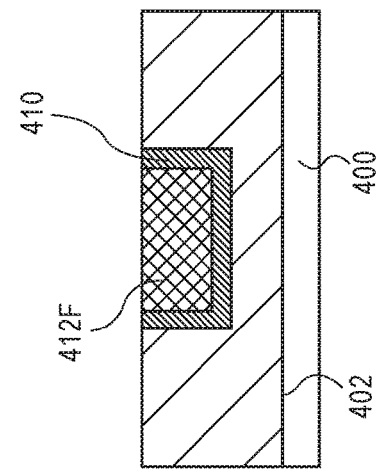
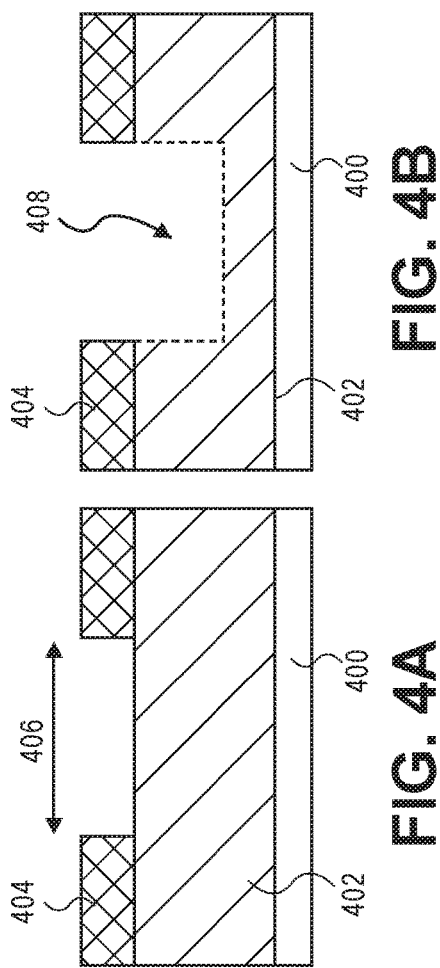
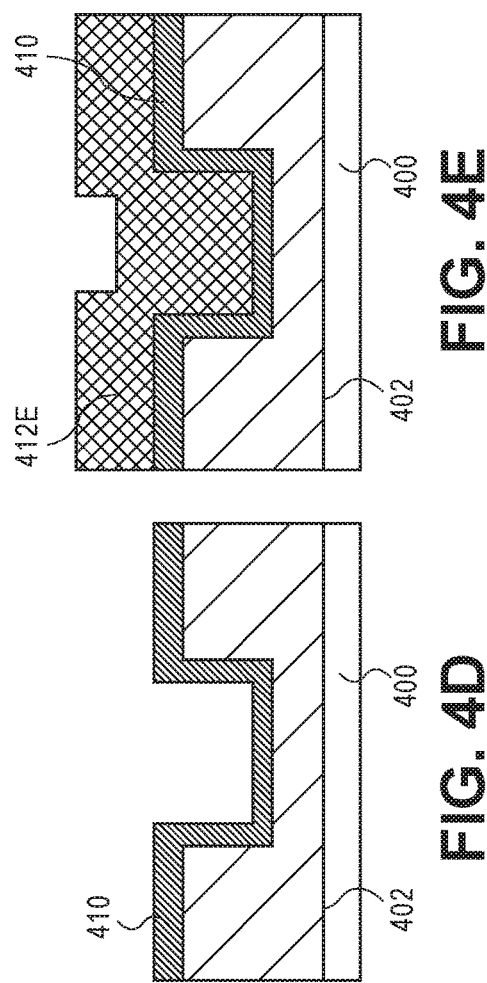

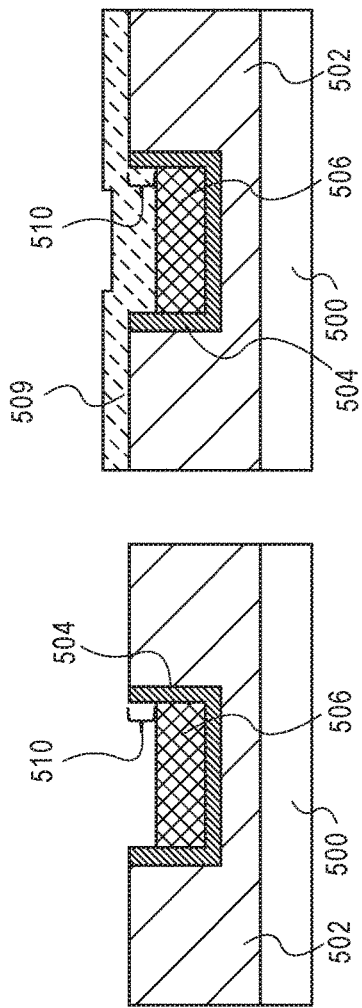
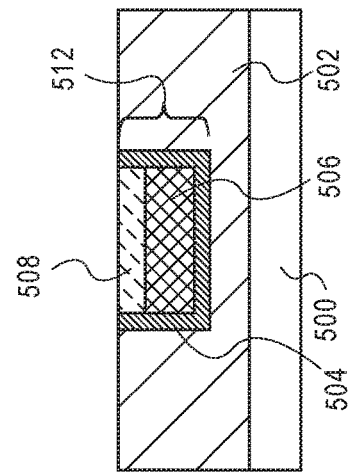
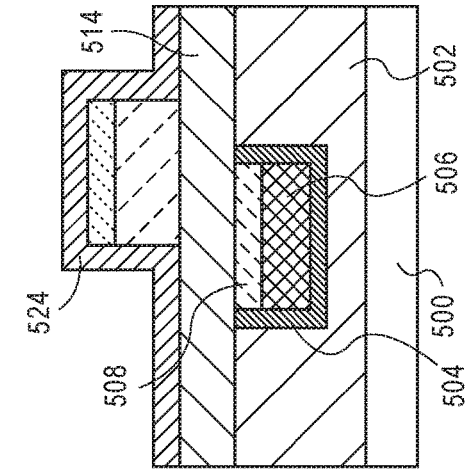
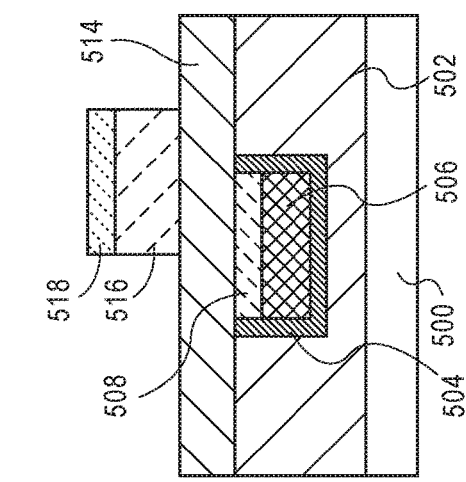
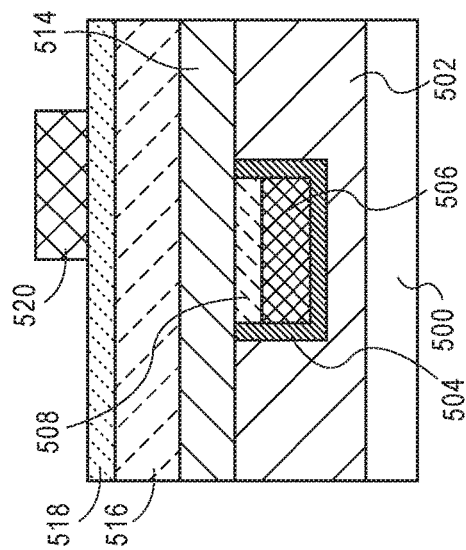

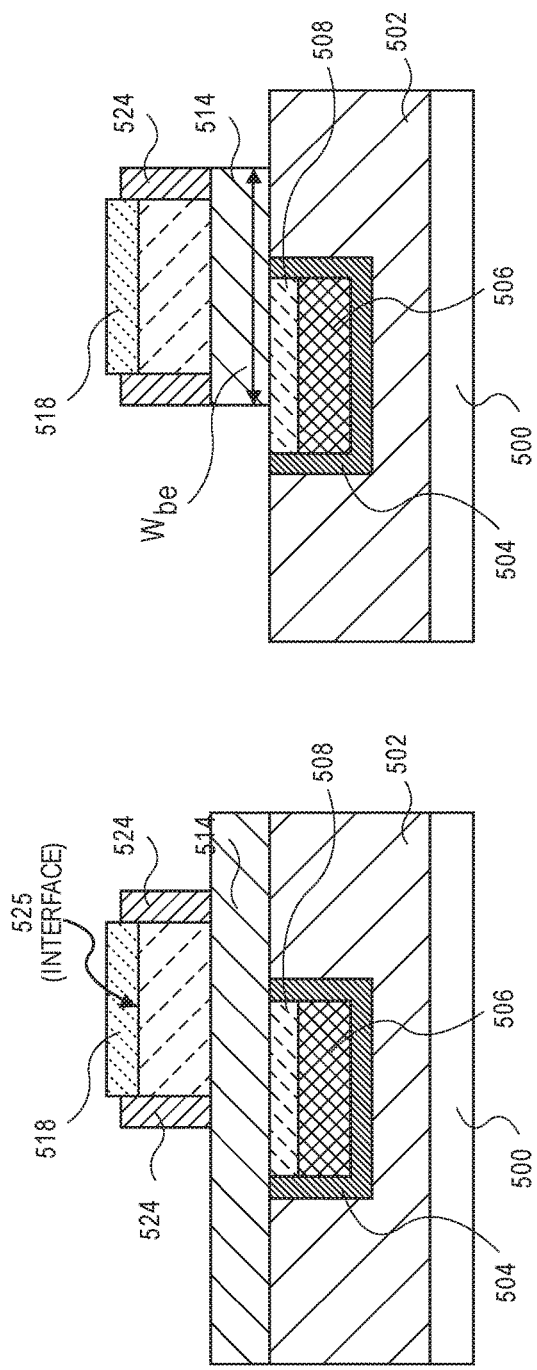
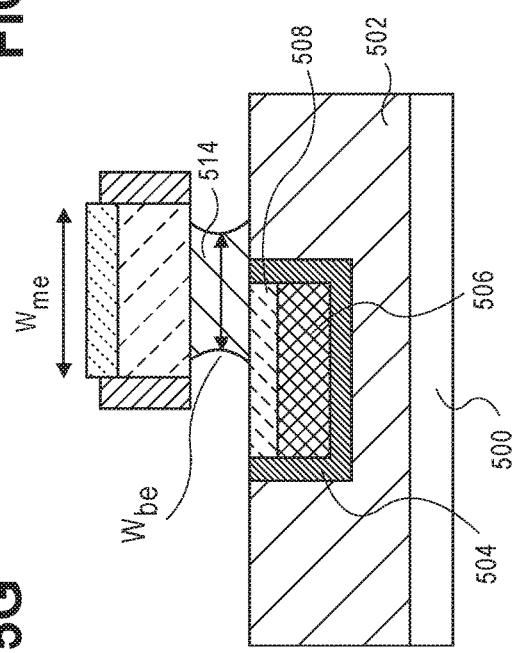

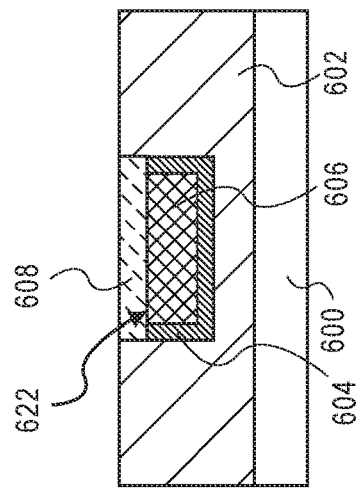
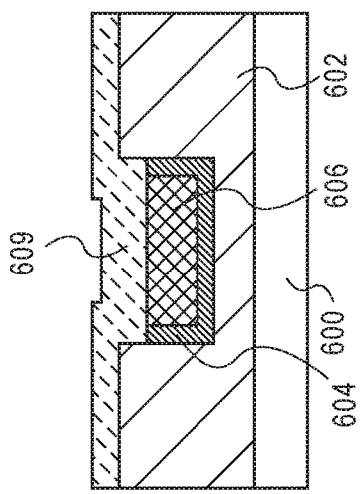
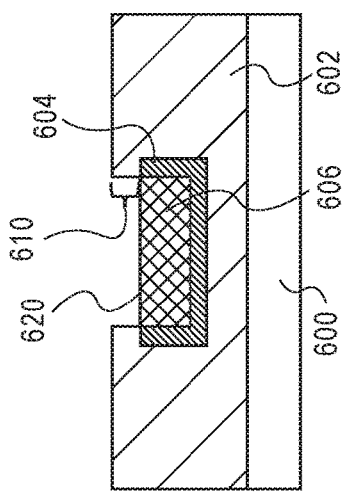
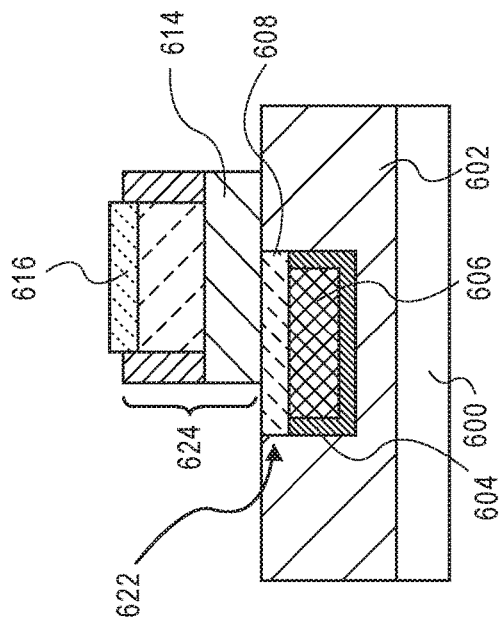

INTERCONNECT CAPPING PROCESS FOR INTEGRATION OF MRAM DEVICES AND THE RESULTING STRUCTURES

CROSS-REFERENCE TO RELATED APPLICATION

This patent application is a U.S. National Phase Application under 35 U.S.C. § 371 of International Application No. PCT/US2016/024555, filed Mar. 28, 2016, entitled "INTERCONNECT CAPPING PROCESS FOR INTEGRATION OF MRAM DEVICES AND THE RESULTING STRUCTURES," which designates the United States of America, the entire disclosure of which is hereby incorporated by reference in its entirety and for all purposes.

TECHNICAL FIELD

Embodiments of the invention are in the field of integrated circuit fabrication and, in particular, approaches for an interconnect cladding process for integrating magnetic random access memory (MRAM) devices, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. It has become increasingly significant to rely heavily on innovative fabrication techniques to meet the exceedingly tight tolerance requirements imposed by scaling.

Non-volatile embedded memory with MRAM devices, e.g., on-chip embedded memory with non-volatility can enable energy and computational efficiency. However, the technical challenges of patterning MRAM devices present formidable roadblocks to commercialization of this technology today. Specifically alignment of MRAM devices onto interconnects with exceedingly small dimensions and pitch sizes, etching MRAM devices without adversely impacting the underlying materials or the device itself are some important areas of process development.

As such, significant improvements are still needed in the area of non-volatile memory integration based on MRAMs.

BRIEF DESCRIPTION OF THE DRAWINGS

FIGS. 1A-1D illustrate cross-sectional views of different embodiments of an MRAM memory element integrated on a conductive interconnect, in accordance with an embodiment of the present invention, wherein:

FIG. 1A illustrates a cross sectional view of a MRAM memory element integrated on an interconnect, wherein the top of the conductive capping layer extends over the conductive fill layer;

FIG. 1B illustrates a cross sectional view of MRAM memory element integrated on an interconnect, wherein the conductive capping layer extends uniformly over the conductive fill layer and the diffusion barrier layer;

FIG. 1C illustrates a cross sectional view of MRAM memory element integrated on an interconnect, wherein the conductive capping layer forms a T shape over the conductive fill layer and the diffusion barrier layer, and FIG. 1D illustrates a cross sectional view of MRAM memory element integrated on an interconnect, wherein the diffusion barrier layer is recessed below the level of the conductive fill layer.

FIGS. 3A-3D illustrate plan views representing combinations of memory elements and interconnects formed in a dielectric layer, in accordance with an embodiment of the present invention, wherein:

FIG. 3A illustrates a plan view representing a plurality of memory elements formed on a conductive interconnect line, wherein the center of the memory element is offset from the longitudinal axis of the interconnect;

FIG. 3D illustrates a plan view representing a memory element formed on a rectangular interconnect, wherein the center of the memory element lies on the longitudinal axis of the interconnect;

FIG. 3C illustrates a plan view representing a memory element formed on a circular interconnect, wherein the center of the memory element is offset from the axis of the interconnect; and FIG. 3D illustrates a plan view representing a memory element formed on a circular conductive via, wherein the radius of memory element is the approximately the same as the radius of the interconnect and wherein die center of the memory element is offset from the center of the interconnect.

FIGS. 4A-4F illustrate cross sectional views representing various operations in a method of fabricating a conductive interconnect, in accordance with an embodiment of the present invention, wherein:

FIG. 4A illustrates a resist pattern formed on a dielectric layer formed on a substrate;

FIG. 4B illustrates the structure of FIG. 4A following an etch process used to transfer the resist pattern into dielectric layer;

FIG. 4C illustrates the structure of FIG. 4B following a resist strip and cleans to remove etch residue;

FIG. 4D illustrates the structure of FIG. 4C following formation of a conductive harrier layer;

FIG. 4E illustrates the structure of FIG. 4D following formation of a fill metal; and FIG. 4F illustrates the structure of FIG. 4E following planarization to remove conductive barrier and conductive fill layer overburden.

FIGS. 5A-5I illustrate cross sectional views representing various operations in a method of fabricating a structure described in FIG. 1A, in accordance with an embodiment of the present invention, wherein:

FIG. 5A illustrates the structure of FIG. 4F following a recess of the fill metal;

FIG. 5B illustrates the structure of FIG. 5A following formation of a conductive capping material;

FIG. 5C illustrates the structure of FIG. 5B following planarization to remove conductive capping metal overburden:

FIG. 5D illustrates the structure of FIG. 5C following formation of conductive bottom electrode, memory element, top electrode layer and patterning of a photoresist layer;

FIG. 5E illustrates the structure of FIG. 5D following an etch process used to transfer the resist pattern into the top electrode layer and the memory device stack;

FIG. 5F illustrates the structure of FIG. 5E following the formation of a dielectric spacer film covering the memory device, top electrode layer and the conductive bottom electrode;

FIG. 5G illustrates the structure of FIG. 5F following an anisotropic plasma etch of the dielectric spacer;

FIG. 5H illustrates the structure of FIG. 5G following an etch of the bottom electrode that exposes the capping layer, the diffusion barrier layer and the dielectric layer; and FIG. 5I illustrates the structure of FIG. 5G following a wet chemical etch of the bottom electrode that exposes the capping layer, the diffusion barrier layer and the dielectric layer.

FIGS. 6A-6C illustrate cross sectional views representing various operations in a method of fabricating a structure described in FIG. 1B, in accordance with an embodiment of the present invention, wherein:

FIG. 6A illustrates the structure of FIG. 4F following recess of the diffusion barrier layer to a level of the fill metal;

FIG. 6B illustrates the structure of FIG. 6A following formation of a conductive capping layer;

FIG. 6C illustrates the structure of FIG. 6B following planarization to remove conductive capping metal overburden; and FIG. 6D illustrates the structure of FIG. 6C following formation of a memory element.

FIGS. 7A-7B illustrate cross sectional views representing various operations in a method of fabricating the conductive interconnect described in association with FIG. 1C, in accordance with an embodiment of the present invention, wherein;

FIG. 7A illustrates the structure of FIG. 4F, following recess of the diffusion barrier layer below the dielectric layer but above the conductive fill layer level; and FIG. 7B illustrates the structure of FIG. 7A, following a polish process.

FIG. 8A-8B illustrate cross sectional views representing various operations in a method of fabricating the conductive interconnect described in association with FIG. 1D, in accordance with an embodiment of the present invention, wherein:

FIG. 8A illustrates the structure of FIG. 4F, following recess of the diffusion barrier layer below the conductive fill layer level; and FIG. 8B illustrates the structure of FIG. 8A, following a polish process.

DESCRIPTION OF THE EMBODIMENTS

Approaches for integrating an MRAM device onto an interconnect formed with a capping scheme, and the resulting structures, are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as switching operations associated with embedded memory, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to methods for integrating MRAM memory devices on an interconnect.

Figure 9:
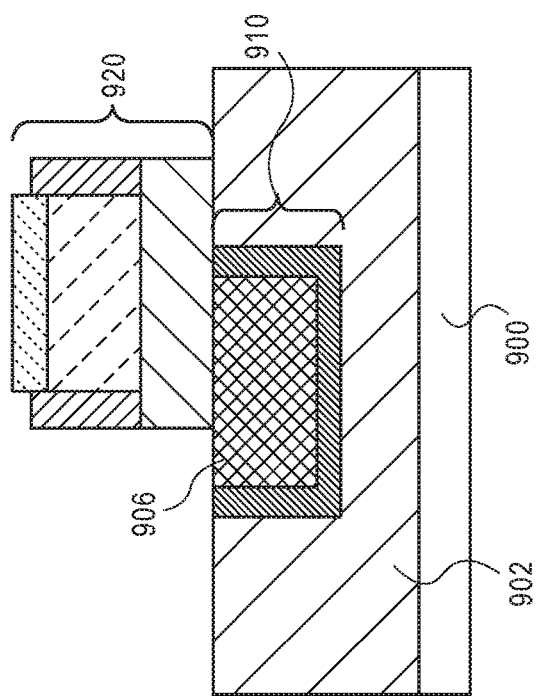
FIG. 9 illustrates a cross-sectional view of a memory element integrated on a conventional conductive interconnect formed in a dielectric layer disposed on a substrate, wherein the fill metal layer is exposed during patterning of the conductive bottom electrode.

To provide context, integrating memory onto a logic element such as a transistor would be advantageous since it enables higher operation speeds compared to having physically separate logic and memory chips. However, approaches to integrate a magnetic random access memory element onto a transistor presents material patterning challenges that have become far more formidable with scaling. An interconnect element, typically containing copper, bridges the memory element with a logic transistor. Copper is usually adopted for its low electrical resistivity, despite being an etch-unfriendly material. The process of integrating memory devices onto a transistor involves etching a film stack containing various metallic and insulating layers and landing on an exposed copper interconnect as illustrated in FIG. 9. A memory element 920 is disposed directly on a conductive interconnect structure 910 an exposed copper fill layer 906. The conductive interconnect structure is formed in a trench in a dielectric layer 902 disposed on a substrate 900. Etching of the memory element 920 and exposing copper leads to (i) unwanted material sputtering onto the sidewalls of the memory device leading to shorting as well as (ii) potential corrosion of the surface and bulk copper. However, in order to exploit the full benefits of a copper interconnect with embedded MRAM memory, insertion of a highly conductive capping layer which offers etch protection during memory element patterning may be needed. Subsequently, such a capping layer may also offer flexibility in the choice of etchants used during formation of the magnetic memory element and materials selected for bottom electrode and diffusion barrier layer.

Figure 1A:
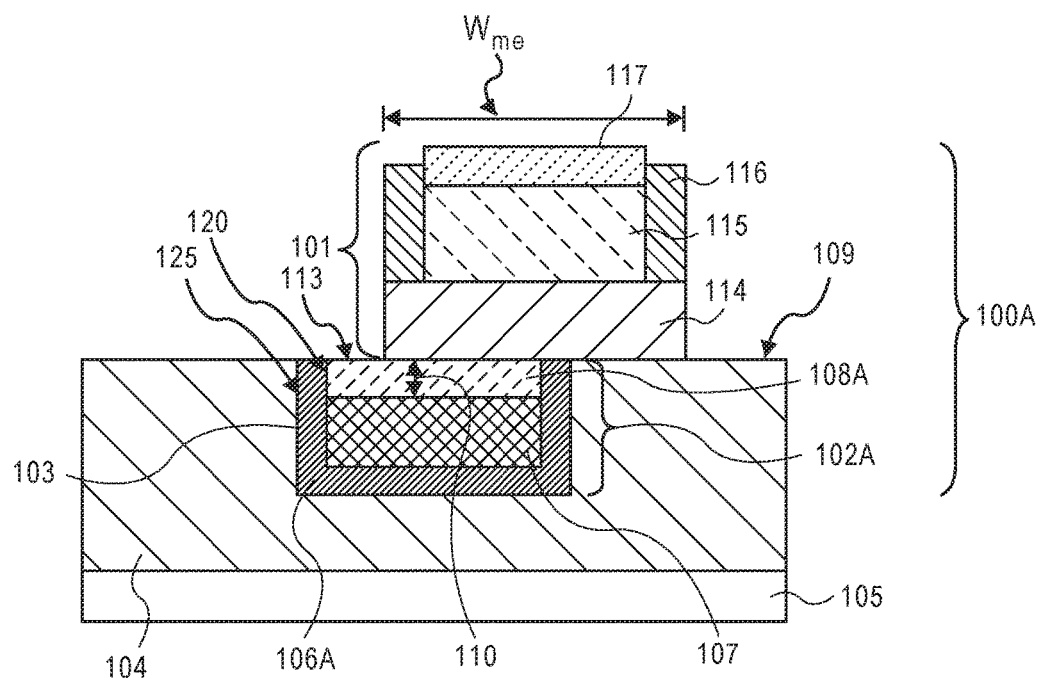
Figure 1B:
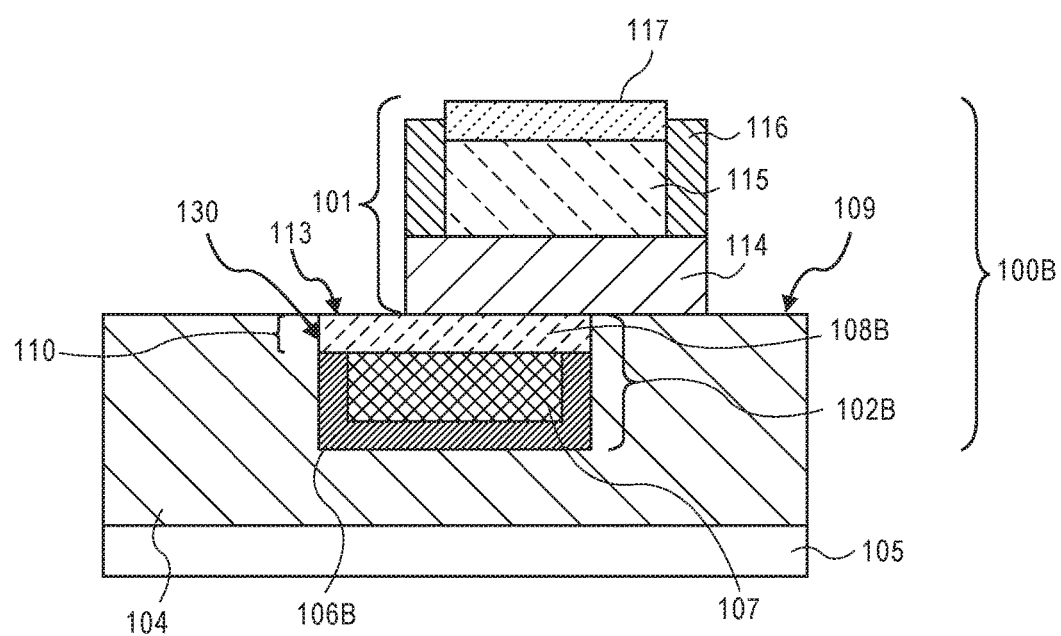
Figure 1C:
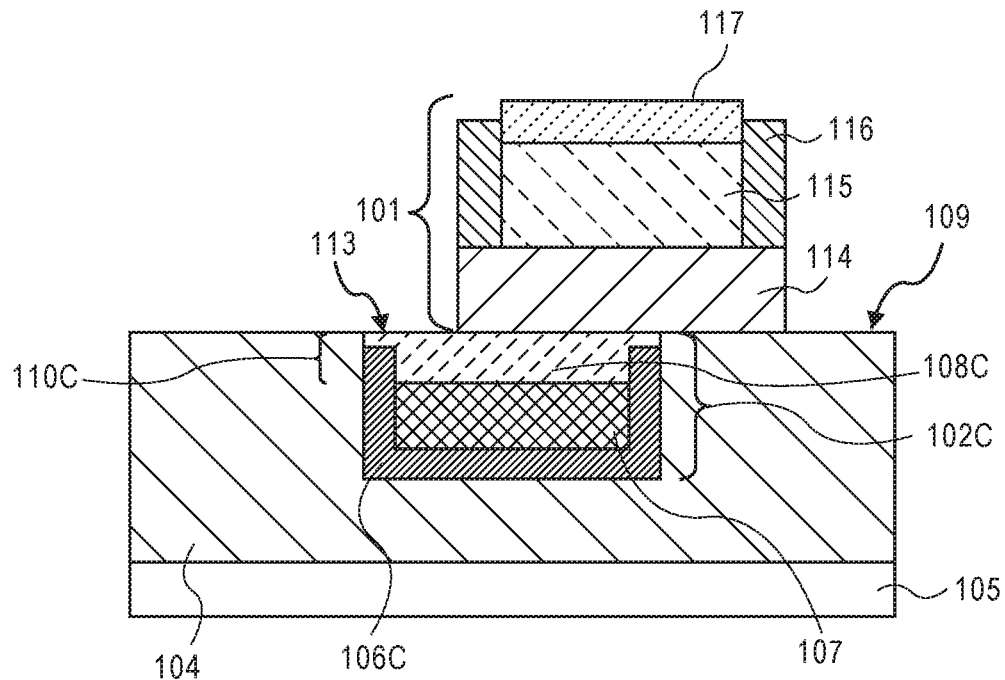
Figure 1D:
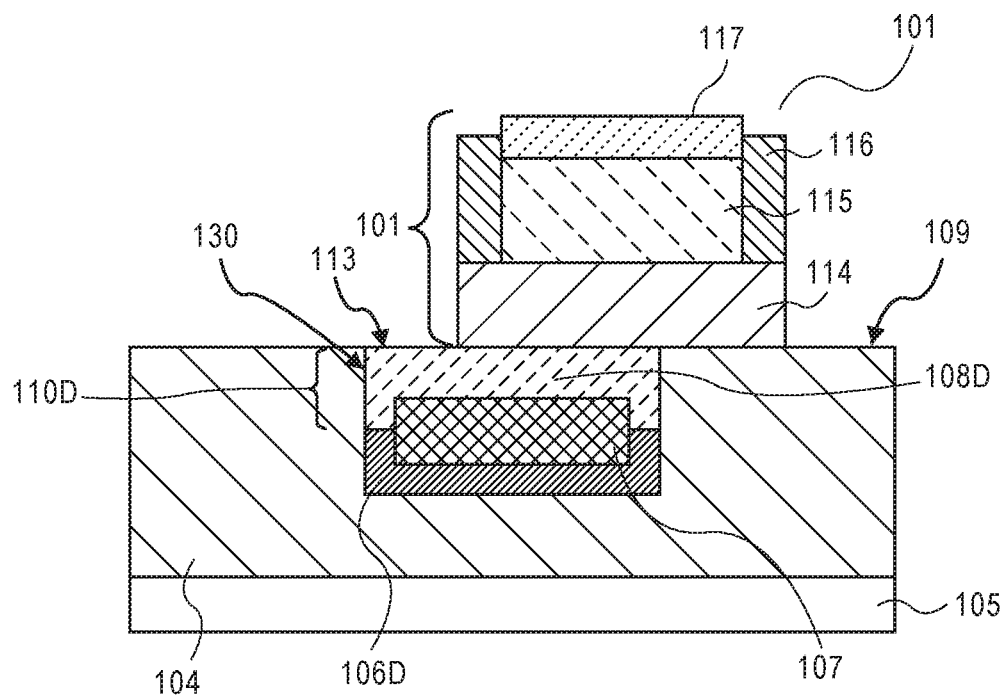

Embodiments of the present invention include forming conductive capping layers that cover one or more layers of the conductive interconnect and have shapes that are influenced by specific operations during the fabrication process. An embodiment where the conductive capping layer is formed above a conductive fill layer is illustrated in FIG. 1A. Further embodiments where the conductive capping layer is formed over a conductive fill layer as well as a diffusion barrier layer are illustrated in FIGS. 1B-1D and will be presented further below.

FIG. 1A illustrates a cross-sectional view of a memory structure 100A, in accordance with an embodiment of the present invention. The memory structure 100A includes a memory element 101 disposed on a conductive interconnect 102A, such as a conductive line or via. The conductive interconnect 102A is disposed within a trench 103 formed in a dielectric layer 104 disposed above a substrate 105. The conductive interconnect 102A includes a diffusion barrier layer 106A, a conductive fill layer 107, and a conductive capping layer 108A. The diffusion bather layer 106A is disposed at the bottom of and along sidewalls of the trench 103. The conductive fill layer 107 is disposed inside the trench and is surrounded by the diffusion barrier layer 106A. The conductive fill layer 107 may be formed from a highly conductive material, such as but not limited to copper. The diffusion barrier layer 106A is between the conductive fill layer 107 and the dielectric layer 104. Diffusion barrier layer 106A may be implemented to prevent electro-migration of the conductive fill layer 107 into dielectric layer 104, and may include a material such as but not limited to Co, Ru or Ta. A recess 110 is above the conductive fill layer 107, such that an uppermost surface of conductive fill layer 107 is below an uppermost surface 109 of dielectric layer 104. The conductive capping layer 108A is disposed on the uppermost surface of conductive fill layer 107, in the recess 110.

In an embodiment, conductive capping layer 108A includes bur is not limited to tantalum, tantalum nitride or ruthenium. A metal, such as Ru is known to be highly conductive even if oxidized. In an embodiment, the conductive capping layer 108A is of the same composition as the barrier layer 106A. However, the conductive capping layer 108A is different from the conductive fill layer 107 and may be more resistive that the conductive fill layer 107. In one embodiment, conductive fill layer is copper, and the conductive capping layer is a material such as Ta, Ru or TaN. In an embodiment, conductive capping layer 108A is co-planar with surface 109 of dielectric 104 and with the uppermost portion of diffusion barrier layer 106A as illustrated in FIG. 1A. In an embodiment, some portion of the conductive capping layer 108A is not covered by memory element 101. The conductive capping layer 108A may be a layer having a thickness that is suitable to protect conductive fill layer 107 during formation of the memory element by a plasma or a wet chemical etch. In an embodiment, a thickness of layer 108A is selected to conform to requirements placed on the net series resistance that it adds to the device.

As depicted in FIG. 1A, in an embodiment only the conductive fill layer 107 is recessed and the diffusion barrier 103 is not recessed or substantially recessed compared to the uppermost surface 109 of dielectric layer 104. The bottom portion of capping layer 108A is in contact with conductive fill layer 107. In an embodiment, the conductive capping layer 108A is laterally adjacent to the sidewalls of the diffusion barrier layer 106A as illustrated in FIG. 1A. The uppermost surface of the conductive capping layer 108A is in contact with the lowest portion of the memory element 101. In an embodiment, the uppermost portions of the capping layer 113, barrier layer 106A and dielectric 104 are all co-planar or substantially co-planar, as is depicted in FIG. 1A. Also illustrated in FIG. 1A are two vertical seams 120 and 125 as result of contact between various interfaces. Vertical seam 120 is formed between the conductive capping layer 108A and the diffusion barrier layer 106A and vertical seam 125 is formed between the diffusion barrier layer 106A and dielectric layer 104.

In an embodiment of the present invention, a memory element 101 is disposed on top of the interconnect structure 102A. The memory element may be a device such as a magnetic random access memory (MRAM) device, a spin torque transfer-magnetic random access (STT-MRAM) device or a conductive oxide random access memory device (CORAM). In an embodiment, memory device 115 is disposed between a bottom electrode 114 and a top electrode 117. Top electrode 117 and bottom electrode 114 may be the same metal, such as but not limited to Ta TaN. In another embodiment, top electrode 117 is Ta and bottom electrode 114 is TiN.

A dielectric spacer 116 may be disposed on the sidewall of the memory device 115 and on top of the bottom electrode 114 as illustrated in FIG. 1A. In an embodiment, the dielectric spacer 116 extends to a height that covers a portion of a sidewall of the top electrode layer 117 and may be a dielectric material such as but not limited to carbon doped nitride or silicon nitride. Since the dielectric spacer 116 is disposed above the bottom electrode 114, the width, $W_{inc}$, of the memory element 101 is equal to the combined width of the memory device 115 and spacer 116. In one or more embodiments, the memory element 101 is in direct contact with (i) only the conductive capping layer 108A, (ii) only the conductive capping layer 108A and diffusion barrier layer 106A, or (iii) with all three layers: conductive capping layer 108A, diffusion bather layer 106A and dielectric layer 104.

While the diffusion barrier layer 106 is coplanar with the conductive cupping layer 108A and dielectric layer 104 in FIG. 1A, in another embodiment, a diffusion barrier layer may be recessed with respect to the uppermost surface 109 of dielectric 104 as illustrated in FIG. 1B. In contrast to FIG. 1A, a diffusion barrier layer 106B is coplanar with a recessed conductive fill layer 107 in FIG. 1B. A conductive capping layer 108B is disposed on the uppermost surface of conductive fill layer 107 and on the uppermost portion of the diffusion barrier layer 106B and fills the recess 110. The two lateral portions of the conductive capping layer 108D are in contact with a single material, the dielectric layer 104, and leads to the formation of a single vertical seam 130 as illustrated in FIG. 1B. This is in contrast to the two vertical seams 120 and 125 illustrated in connection with FIG. 1A.

It is to be appreciated that the diffusion harrier layer may be recessed to a different extent than the recess of the conductive fill layer 107. As illustrated in FIG. 1C, a diffusion barrier layer 106C of conductive interconnect 102C, is below the level of surface 109 of dielectric 104. However, the uppermost surface of the diffusion barrier layer 108C is above the uppermost surface of the conductive fill layer 107. A recess 110C has a portion above the diffusion barrier layer 106C and a portion above the conductive fill layer 107. This results in a smaller recess depth above the diffusion harrier layer 106C than above the conductive fill layer 107. The conductive capping layer 108C is disposed on the uppermost portion of the conductive fill layer 107 and on the uppermost surface and along a small vertical portion of the harrier layer 106C resulting in a T shape.

On the other hand, in FIG. 1D, a diffusion barrier layer is recessed below the level of the conductive fill layer metal 107. The conductive capping layer 108D is disposed on diffusion barrier layer 106D and on the uppermost surface and along a portion of a sidewall conductive fill layer 107. A recess 110d in contrast to recess 110C, has a portion that is smaller above the uppermost surface of conductive fill layer 107, than above the diffusion battier layer 106D. Consequently, the conductive capping layer 108D has a thickness that is greater over the diffusion bather layer than on the uppermost surface of conductive fill layer 107. Referring again to FIG. 1B, FIG. 1C and FIG. 1D, the memory element 101 is disposed on portion of the uppermost surface 109 and uppermost surface 113.

Figure 2:
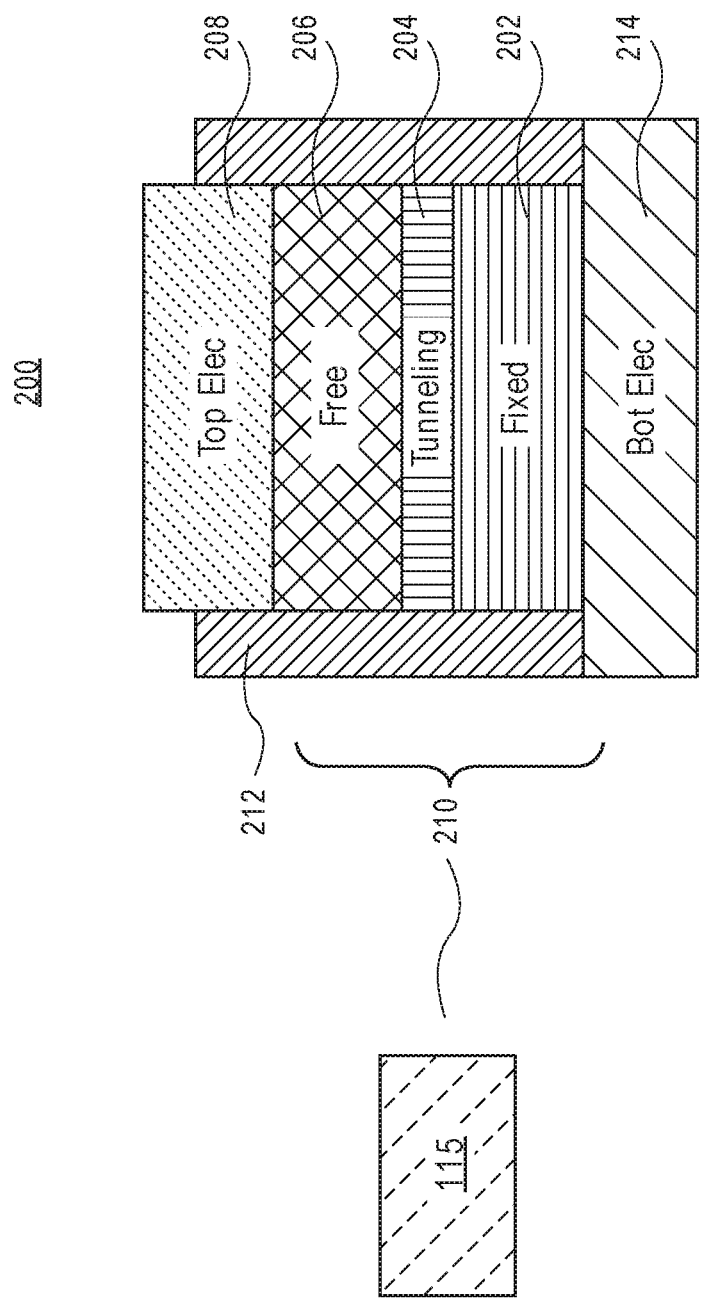
FIG. 2 illustrates a cross sectional view of a material layer stack for an MRAM memory element, in accordance with an embodiment of the present invention.

FIG. 2 illustrates the components of a memory element 200 which may include a top electrode 208, a bottom electrode 214 and a memory device 210 disposed there between. To one embodiment the memory device 115 is a magnetic random access memory device 210. It is to be appreciated that although a memory device 210 may include a stack having multiple layers of metallic and metal-oxide films, for the sake of simplicity it is divided into 3 portions in FIG. 2: a fixed magnetic layer 202 disposed on a bottom electrode 214, a free magnetic layer 206 and a tunnel layer 204 sandwiched between the fixed magnetic layer 202 and free magnetic layer 206. A top electrode 208, disposed on the free magnetic layer 206, serves as a metal contact between the memory device 200 and the rest of a circuit. A bottom electrode 214 is directly below the fixed magnetic layer 202. The thickness of the bottom electrode ranges from 5-50 nm, and in an embodiment includes a material such as TiN, Ta or Ru. In an embodiment a dielectric spacer 212, encapsulating the memory device 210, is disposed on the bottom electrode 214 as shown in FIG. 2. Dielectric spacer 212 extends along a sidewall of the memory device to a portion of the top electrode 208. In another embodiment, dielectric spacer 212 is disposed along a sidewall of CO bottom electrode 214, (ii) fixed magnetic layer 202, (iii) tunneling layer 204, (iv) free magnetic layer 206 and (v) along a portion of a sidewall of top electrode 214. It is to be appreciated that the memory device 210 stack may be reversed, in that layer 206 may be a fixed magnetic layer while layer 202 may be a free magnetic layer. Although in such an instance, the constituents of the two respective layers will also be reversed. That is, in an embodiment free and fixed layers are not merely nomenclatures but represent tangible quantities that are inherently related to intrinsic spin and angular momentum properties of the material.

Referring to FIG. 2, in an embodiment, the free magnetic layer 206, is composed of a material suitable for transitioning between a majority spin and a minority spin, depending on the application. Thus, the free magnetic layer 206 (or memory layer) may be referred to as a ferromagnetic memory layer. In one embodiment, the free magnetic layer 206 is composed of a layer of cobalt iron (CoFe) or cobalt iron boron (CoFeB).

Referring again to FIG. 2, in an embodiment, the tunneling layer 204 is composed of a material suitable for allowing current of a majority spin current to pass through the layer, while impeding at least to some extent current of a minority spin to pass through the layer. In one embodiment, the tunneling layer 204 is composed of a material such as, but not limited to, crystalline magnesium oxide (MgO) or aluminum oxide ($Al_2O_3$). In one embodiment, the tunneling layer 204 has a thickness approximately in the range of 0.8-1.2 nm.

Referring again to FIG. 2 the fixed magnetic layer 202 is composed of a material or stack of materials suitable for maintaining a fixed majority spin. Thus, the fixed magnetic layer 202 (or reference layer) may be referred to as a ferromagnetic layer. In one embodiment, the fixed magnetic layer 202 is composed of a single layer of cobalt iron boron (CoFeB). However, in another embodiment, the fixed magnetic layer 202 is material stack including a cobalt iron boron (CoFeB) layer, a ruthenium (Ru) layer, and a cobalt iron boron (CoFeB) layer stack. In one embodiment, a pinned layer for a pMTJ includes (Co/Pt)x/Co/Ru/FM, where x=2-10, and FM=ferromagnet which can be (Co/Pt)y where y is smaller than x to balance stray field felt at switching layer. In one embodiment, for an iMTJ, the pinned layer is NW or IrMn in contact with CoFe that is annealed above the Neel temperature of PtMn antiferromagnetic layer and then allowed to cool under application of an in-plane field to freeze magnetic orientation at the AFM/FM interface.

The effect of offset of memory elements over the conductive interconnect may be viewed best from above the memory elements. A plan view illustrating a plurality of memory elements 300 disposed on an interconnect structure 306 is depicted in FIGS. 3A and 3B. Of the memory element 300, only the top electrode 308 surrounded by a dielectric spacer 310 can be seen in the plan view. A cross section through the line A-A' represents an embodiment illustrated in FIG. 1A, where the uppermost portion of the diffusion barrier layer 304 is coplanar with conductive capping layer 302 and dielectric layer 306. The diffusion barrier layer 304 may be, however, covered by the conductive capping layer 302 in other embodiments, as shown in FIGS. 1B-1D. The longitudinal axis of the interconnect structure 320 is a line labeled L-L'. The center of memory element, $M_o$, maybe positioned off axis from L-L' in one embodiment (e.g., FIG. 3A) and aligned perfectly with L-L' in another (e.g., FIG. 3B).

Referring again to FIG. 3A, in this embodiment the width of the memory element 300. $W_{be}$, outlined by dielectric spacer 310, is smaller than the width of the conductive capping material, $W_{cap}$. In another embodiment, $W_{be}$ may be greater than $w_{cap}$. It is to be noted, that positioning and size of memory elements 300 will affect the amounts of conductive capping layer 302 exposed in the conductive interconnect 306.

Figure 3D:
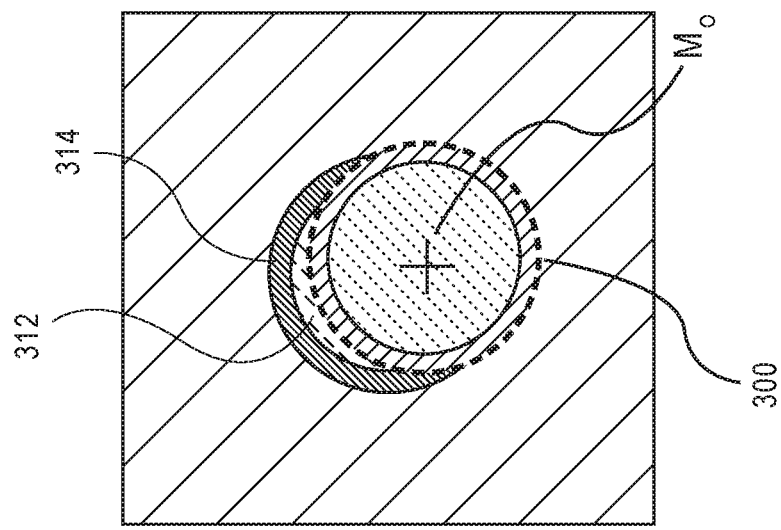
Figure 3C:
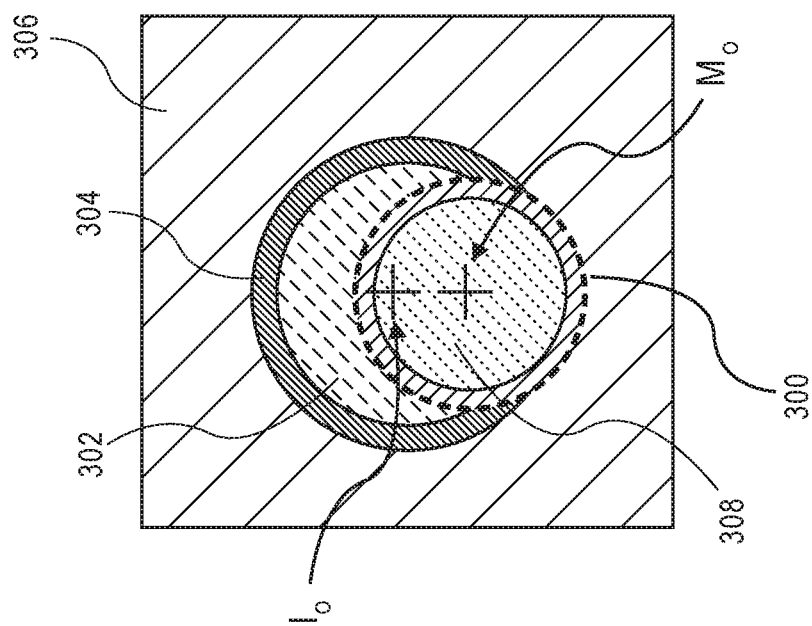

In an embodiment where the conductive interconnect 300 is a via, FIG. 3C illustrates a plan view, wherein the center of the memory element, $M_o$, is offset from the center of the interconnect, $I_o$. In such an embodiment the width, $W_{be}$ of memory element 300 is smaller than the width, $W_{cap}$ of the conductive capping layer 302. FIG. 3C also highlights a surface area of the conductive capping layer 302 that would ultimately be exposed during formation of memory element 300. FIG. 3D illustrates a plan view representing a memory element formed on a circular conductive via, wherein the width. $W_{ho}$ of memory element 300 is the approximately the same as the width, $W_{cap}$ of the conductive capping layer 302. The center of the memory element, $M_o$, is offset from the center of interconnect, $I_o$.

FIGS. 4A-4F illustrate cross sectional views representing various operations in a method of fabricating a conductive interconnect such a line or a via, in accordance with embodiments of the present invention. As illustrated in FIG. 4A, the fabrication approach begins with a starting dielectric layer 402 formed above a substrate 400. In an embodiment, one or more dielectric layers 402 are used. Layer 402 may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetratluoroethylene, fluorosilicate glass (FSG), and organosilicates such as silsesquioxane, siloxane, or organosilicate glass. The dielectric layer 402 may include pores or air gaps to further reduce their dielectric constant. In an embodiment, the total thickness of dielectric layer 402 may be in the range of 2000 A-3000 A. The height of the resulting interconnect, interconnect electrical resistance as well as amount of dielectric layer 402 that may be sacrificed during the interconnect fabrication process.

Referring again to FIG. 4A, a photoresist layer 404 is applied to the wafer surface and patterned over the dielectric layer 402. Photoresist layer 404 may include other patterning materials such as anti-reflective coatings (ARC) and gap-fill and planarizing materials in addition to or in place of a photoresist material. Photoresist 404 is formed to a thickness sufficient to retain its profile while patterning dielectric layer 402 but yet is not formed too thick to prevent lithographic patterning into the smallest dimensions (i.e., critical dimensions) possible with photolithography system and process used. The photoresist when developed may form a via or a fine pattern 406. The width of the via or line 406 can range from 30-100 nm.

Referring to FIG. 4B, a trench 408 is formed in the dielectric layer 402. In an embodiment, an anisotropic plasma etch process is used to pattern trench 408 in dielectric layer 402 with selectivity to the photoresist layer 404. A selectivity of greater than 5 to 1 between photoresist material and dielectric material may be desirable. In other words, the rate of removal of dielectric layer 402 should be more than 5 times the rate of erosion of the photoresist to create a trench whose width is not appreciably larger than the original via or line width 406. Chemical etchants utilized in the plasma etch process will depend on the dielectric material being etched, and may include but not be limited to $CH_xF_y$, $O_2$, Ar, $N_2$ and $CF_4$. Sidewall angles of trench 408 can be tailored in one or more embodiments to vary from 80-90 degrees depending on the type of etch conditions employed as is well known in the art. For a given trench size, tapered sidewalls may accommodate deposition of metals that may not ordinarily fill conformally, even if they exhibit mechanical, chemical or electrical advantages. For example, metals such as Co or Ta which may be used in this application, is usually disposed using physical vapor deposition (PVD) or chemical vapor deposition (PVD) techniques. For the purposes of forming an interconnect, the trench depth may range from 100-200 nm. The requirement to suppress features such as key holes and seams arising from specific deposition techniques of a conductive fill layer may also dictate the depth of the trench.

FIG. 4C illustrates the structure of FIG. 4B following a plasma based photoresist removal process, plasma ashing or just ash process. The ash process, which may include a gas containing $O_2$, $H_2/N_2$, removes photoresist 404 selectively to the dielectric layer 402. A wet chemical cleaning process or wet cleans is subsequently utilized to remove any residue and defects generated during the anisotropic plasma etch and ash process. In one embodiment, a mixture containing buffered hydrofluoric acid is used to remove residue so as to minimize increase in width of trench 408. The bottom of trench 408 in one embodiment is flat, but curved surfaces may also be formed depending on the wet cleans chemistry adopted.

Following the wet cleans process, a diffusion barrier layer 410 in a thickness range of 5-10 nm is disposed in the trench as shown in FIG. 4D. Examples of suitable barrier layer materials that may be used include, but are nor limited to, cobalt, tantalum, tantalum nitride and ruthenium. Deposition techniques that are commercially available today such as atomic layer deposition (ALD), physical vapor deposition (PVD) or chemical vapor deposition (CVD) may be utilized. In an embodiment, the diffusion barrier layer 410 is deposited onto the entire wafer surface, filling into the thin trench 408 and covering the entire wafer surface.

Referring to FIG. 4E, the structure of FIG. 4D following deposition of a conductive fill layer 412e is illustrated. The conductive fill layer 412c is deposited onto the entire wafer surface, filling into the thin trench openings. Typically, the uppermost level of the conductive fill layer in trench 408 will be 40-60 nm higher than the level of uppermost surface of the dielectric 402. Materials suitable for conductive fill layer 412e may include Cu or Al. Additional factors that may influence the amount of conductive fill layer disposed include (i) trench depth which ranges from 100-200 nm, (ii) trench width ranging from 30-100 nm, (iii) amount of overburden needed and (iv) the need to suppress features of the conductive fill layer in trench 408 arising from the material choice and fill techniques utilized.

As illustrated in FIG. 4F a trench, which may be line or a via, is lined with a diffusion barrier layer 401 on all sides and filled with a conductive fill layer. In an embodiment a co-planar or substantially co-planar uppermost surface of dielectric layer 402, diffusion harrier 410 and conductive fill layer 412f is a result of a planarization or polish process carried out to remove conductive fill material overburden of the conductive fill layer 412e and diffusion harrier layer 410. The planarization process stops on the underlying dielectric layer 402 and leaves conductive fill layer 412f and harrier layer 410 in the openings of the trench 408. Accordingly, after planarization layers 410 and 404 are completely removed from the upper surface of the wafer. In one embodiment the relative polish rates of conductive fill layer 412f, the barrier layer 410 and the dielectric 402 may be identical or nearly identical, with no appreciable dishing of layer 412f inside the trench. Furthermore, the surface of conductive fill layer 412f in one or more embodiments is determined by a combination of the grain size of the conductive fill material and polish roughness.

FIGS. 5A-5H illustrates a sequence of process operations to fabricate the structure represented in FIG. 1A in accordance with an embodiment of the present invention.

FIG. 5A illustrates the structure of FIG. 4F following a wet chemical recess 510 of the conductive rill layer 506. In one embodiment the process that recesses the conductive fill layer 506 is selective to diffusion barrier layer 504 and dielectric layer 502. In other words, there is little to no etch of diffusion barrier layer 504 or dielectric 502 during recess of the conductive fill layer 506. Wet chemicals utilized for the recess process may include hut are not limited to the following: $HNO_3$, mixtures of HCl, $FeCl_3$ and $H_2O$ and mixture containing $NH_3$ and $H_2O$. In an embodiment, total recess 510 of a Cu fill layer may range from 15-20 nm in order to accommodate subsequent processing operations.

FIG. 5B illustrates the structure of FIG. 5A following the deposition of a conductive capping layer 509 on a recessed upper surface of conductive fill layer 506, on the uppermost portion of diffusion barrier layer 504, and on the dielectric layer 502. Dielectric layer 502 is disposed on a substrate 500. In an embodiment, the conductive capping layer 508 is deposited onto the entire wafer surface, filling the recess 510. Capping materials may include but are not limited to Ta, TaN and Ru. Factors influencing the choice of capping materials may include resistance to ion bombardment during etching of the memory element and minimizing any electrical resistance. In an embodiment, the deposited thickness of the conductive capping layer 509 can range from 1.5-2 times the depth of the recess 510 of the conductive fill layer 506 to mitigate potential dishing effects of polish.

Referring to FIG. 5C, a conductive capping layer 508 is formed on the conductive fill layer 506. Lateral portions of conductive capping layer are in contact with the diffusion barrier layer 504. In an embodiment a polish process removes overburden of the conductive capping layer 508 deposited on the surface of dielectric layer 502. Accordingly, after CMP, conductive capping layer 508 is left only on the uppermost portion of the conductive fill layer 506 and adjacent to diffusion harrier layer 504. In an embodiment, the resulting conductive capping layer accommodates two competing requirements. (i) being sufficiently thin so that the net resistance of the conductive interconnect is not increased and (ii) being sufficiently thick so that it may offer protection during subsequent process operations. In an embodiment, the capping layer ranges from 3-10 nm given the tolerances in cross wafer polish uniformity. The coplanarity of conductive capping layer 506, diffusion barrier layer 504 and dielectric 502 may assist in achieving a uniform surface for deposition of the subsequent layers.

Interconnect structure 512, thus formed, serves as the foundation for forming a memory element 101 thereon, as illustrated in FIG. 1A.

FIG. 5D illustrates the structure of FIG. 5E in an embodiment following the sequential deposition of the following layers. First, a bottom electrode layer 514 is disposed over the entire wafer surface. In one or more embodiments bottom electrode layer 514 is a material such as, but not limited to, TiN, Ru, TaN or W. Next, the memory device stack 516 including a free magnetic layer, tunneling layer and a fixed magnetic layer is deposited over the bottom electrode 514. The materials including the fixed and free magnetic layers, include but are not limited to CoFe, CoFeB, Pt, IrMn, and Co—Pd multilayers and can range from 30-100 nm in total thickness. The tunnel layer in an embodiment is MgO and has a thickness of 1 nm. Next, the memory device stack is capped by a top electrode layer 518 ranging in thickness from 50-100 nm and including of layers such as Ta, TaN, or Ta—Ru multilayer. A photoresist layer 520, is deposited on the top electrode and formed into a mask containing discrete photoresist regions. Each photoresist region 520 defines location where a single memory device will ultimately be formed. In one or more embodiments, the thickness of the top electrode layer 518 is chosen to for its ability to (i) be patterned with a given thickness of photoresist (ii) provide a hardmask to withstand erosion during etch of the memory device stack 516, dielectric spacer and bottom electrode layer 514.

Referring again to FIG. 5D, in an embodiment, the top electrode layer 518 and the conductive capping layer 508 can be the same material such as Ta and the bottom electrode may be TiN. In another embodiment, top electrode layer 518 is composed of a material or stack of materials suitable for electrically contacting the fixed or free layers in memory device 516. In an embodiment, where the top electrode layer 518 is a topographically smooth electrode, the layer 518 has a thickness suitable for good conductivity but has little to no columnar structure formation that would otherwise lead to a rough top surface. Such a topographically smooth electrode may be referred to as amorphous in structure.

Referring to FIG. 5E, an anisotropic plasma etch process is used to transfer the outline of the photoresist dot 520, of the structure in FIG. 5C, into a top electrode layer 518, and then into the memory device stack 516. In one embodiment, the resist dot may be fully consumed by time the top electrode layer 518 is fully etched. In another embodiment, a portion of the photoresist dot 520 may remain until the uppermost surface of the memory device layer 516 is exposed, but be consumed by the time the bottom electrode 514 is exposed. It is to be noted that polymeric films, which may result from the interaction between photoresist and etch byproducts during memory device etch, may adhere to the sidewall portions of the top electrode 518 and memory device 516. If portions of such polymeric layers have metallic components, device performance can be significantly degraded. Hence, removal of the photoresist layer 520 before etching memory device layer 516 is often desirable. In some embodiments the photoresist 520 may be ached immediately after the top electrode layer 518 is patterned. In such an embodiment, the magnetic materials in the memory device layer 516 are then etched using RIE plasma etch techniques well known in the art, utilizing the top electrode layer 518 as a hardmask and mop on (or at most partially etch into) the bottom electrode metal layer 514.

In one embodiment after the memory device layer 516 is etched and bottom electrode 514 is exposed, the wafer surface is covered with a dielectric spacer layer 524. In an embodiment, as illustrated in FIG. 5F, deposition of dielectric spacer layer 524 may be performed, immediately post memory device etch but, prior to breaking vacuum. Such a procedure, known in the art as in-situ deposition, may hermetically seal the device and potentially decrease oxidation of sensitive magnetic layers post air exposure. Some materials used for dielectric spacer layer 518 include silicon nitride, silicon carbide, silicon oxynitride and carbon-doped silicon oxynitride. Thickness of the dielectric spacer may range from 10-40 nm, a value that may in part be also dictated by the cross sectional profile of the top electrode 518 and memory device 516. In an embodiment where the memory device 516 and top electrode 518 sidewalls are slanted between 75-90 degrees, the dielectric spacer may need to be thicker to allow adequate dielectric spacer coverage post a plasma etch.

FIG. 5G illustrates the structure of FIG. 5F following an anisotropic plasma etch of the dielectric spacer 524. In an embodiment of the present invention, a silicon nitride or silicon oxynitride dielectric spacer is reactive ion etched utilizing chemistry including $CHF_3$ and $O_2$ and $Ar/CH_2F_2$ and $C_4F_8$ and Ar and $O_2$. Post etch, the uppermost and sidewall portion of the top electrode 518 and the uppermost surface of bottom electrode 514 are exposed. In an embodiment, patterning of dielectric material with energetic radicals of fluorine containing chemistries also results in etching of metal films such as TiN, Ta, TaN and W. The need to preserve top electrode layer 518 may result in utilizing a modified spacer over etch process. In one such embodiment, an over etch operation with (i) a time duration of 20-30% of the main etch rime and (ii) reduced ion energy of the reacting species is utilized to gently clean up dielectric spacer 524 over the entire wafer surface. An etch selectivity of 10:1 between dielectric spacer 524 and top electrode layer 518 and between dielectric spacer 524 and bottom electrode layer 514 may be adequate for completely etching a 10-40 nm thick dielectric spacer layer. It is to be appreciated that the height of the dielectric spacer layer 524 along the sidewall of memory device layer 516 and the top electrode 518 depends on the duration of the spacer over etch process. In an embodiment, dielectric spacer layer 524 may extend halfway up the side wall of the top electrode layer 518 so as to cover interface 525 illustrated in FIG. 5G, post etch.

Structure 512 in FIG. 5H, illustrates the structure of FIG. 5G following an anisotropic plasma etch of bottom electrode 514. In an embodiment, one such plasma etch interacts with six different material surfaces. Three of these layers are exposed at the onset of the bottom electrode etch, namely (i) the top electrode 518, (ii) the dielectric spacer 524 and (iii) bottom electrode layer 514. Three more layers are further exposed once the bottom electrode layer 514 has been completely patterned, namely (iv) conductive capping layer 504, (v) diffusion harrier layer 504 and (vi) dielectric layer 502. The physical or chemical nature of etch, the type and combination of etchants to be utilized, the number of etch operations and the duration of each operation are some important parameters for patterning bottom electrode layer 514. In an embodiment selective etching of a TiN bottom electrode layer 514 can be carried out using either a dielectric or a metal hardmask. In such an embodiment, a multi-operation plasma etch containing $Cl_2$ and Ar, is used to etch a TiN bottom electrode layer 514 selectively to Ta top electrode layer 518 and dielectric spacer layer 524. Towards the end of the bottom electrode etch process, the plasma bias power, a factor that controls bombardment energy of the reacting ions, can be reduced to mitigate etch damage to layers below the bottom electrode layer 514. In an embodiment, a low biased plasma etch can add a taper to the profile of the bottom electrode 514 and increase the width, $W_{be}$, by 0-10 nm. In an embodiment, where the conductive capping layer 508 is made of the same material as the top electrode 518, high etch selectivity during etch of bottom electrode 514 can allow conductive capping layers 508 to be as thin as a 3-5 nm.

Bottom electrode layer 514 may also be chemically recessed using well known wet etch processes that are physically gentler on underlying thin films as illustrated in FIG. 5I. In an embodiment that utilizes one such wet etch process; the thickness of the capping layer is 2-3 nm and is determined mostly by cross wafer tolerances in the polish process. Furthermore, in an embodiment, a wet etch process while physically gentler than plasma etch, may potentially lead to undercut in the bottom electrode layer 514 as illustrated in FIG. 5I. The width, $W_{be}$, of the bottom electrode 514, may be smaller than the width, $W_{me}$, of the memory device 516, due to a wet chemical undercut etch. It is to be appreciated that since the size of a memory device 516 is determined by the width of the tunneling layer in the device ($W_{be}$, in this embodiment). Hence, small variations in the width of the bottom electrode, $W_{be}$, may not adversely impact device performance provided such changes do not impact electrical resistance of the bottom electrode layer 514.

It is to be noted that reducing the number of layers in a given structure that are exposed to either plasma or a wet etch may offer increased process flexibility. In accordance with an embodiment of the present invention, referring again to FIG. 1B, the diffusion barrier layer 104 is capped by the conductive capping layer 108.

FIGS. 6A-6D illustrate cross sectional views representing various operations in a method of fabricating a structure described in FIG. 1B, in accordance with an embodiment of the present invention.

FIG. 6A illustrates the structure of FIG. 4F, where the diffusion barrier layer 604 and the conductive fill layer 606 are recessed such that the uppermost surfaces of the diffusion barrier layer 604 and the conductive fill layer 606 are coplanar or substantially coplanar. Depending on the embodiment the order of the recess may be carried out in one of the three ways (i) the conductive fill layer may be recessed first followed by the diffusion barrier layer (ii) the diffusion barrier layer may be recessed first followed by the conductive capping layer and (iii) the diffusion barrier layer and the conductive capping layer may be recessed at the same time. In one embodiment wet chemicals utilized to recess a Ta or Ru diffusion barrier layer selective to a copper fill layer and dielectric layer include but are not limited to an acid peroxide mixture. In one such embodiment, the recess 610 of diffusion barrier layer 604 and conductive fill layer ranges from 10-20 nm. FIG. 6B illustrates the structure of FIG. 6A following deposition of a conductive capping layer 609 on the diffusion barrier layer 604, on the conductive fill layer 606 and along the sidewall of and on the uppermost surface of the dielectric layer 602.

Referring to FIG. 6C, a conductive capping layer 608 is formed on the uppermost surface of conductive fill layer 606 and an uppermost surface of diffusion barrier layer 604. Lateral portions of conductive capping layer are in contact with the dielectric layer 602. In an embodiment a polish process removes overburden of the conductive capping layer 608 deposited on the surface of dielectric layer 602. Accordingly, after CMP, conductive capping layer 608 is left only on the uppermost portion of the conductive fill layer 606 and the uppermost surface of diffusion barrier layer 604. In an embodiment, the resulting conductive capping layer accommodates two competing requirements, (i) being sufficiently thin so that the net resistance of the conductive interconnect is not increased and (ii) being sufficiently thick so that it may offer protection during subsequent process operations. In an embodiment, the capping layer ranges from 3-10 nm given the tolerances in cross wafer polish uniformity. The co-planarity of conductive capping layer 606, diffusion barrier layer 604 and dielectric 602 may assist in achieving a uniform surface for deposition of the subsequent layers. In an embodiment, the polish process involves a multi-recipe process where the first recipe targets removal of the conductive capping layer everywhere in the field. With a very slow polish rate of the dielectric layer 602 the conductive capping layer 608 can be over polished, confining the material within the trench. A second polish recipe, utilizing a significantly different polish slurry, can then polish the conductive capping layer 608 to a level that is coplanar (or sufficiently coplanar) with the dielectric layer 602. Such a multi recipe process may also reduce edge defects at a vertical scam 622 between a dielectric layer 602 and a metal layer 608. In the cross sectional illustration in FIG. 6C, the conductive capping layer 608 maintains uniformity across the extent of the conductive interconnect.

Referring again to FIG. 6D, memory element 624 is formed above a portion of the conductive capping layer 608 and on a portion of the dielectric layer 602. In an embodiment where anisotropic plasma etch is utilized to pattern bottom electrode 614, the etchants bombard top electrode 616, conductive capping layer 608 and dielectric 602. In an embodiment diffusion barrier layer 604 and conductive fill layer 606 are both protected if the vertical seam 622 is not eroded when bottom electrode 614 is patterned by either a plasma etch, a wet etch or a combination of both. It is to be appreciated that if the diffusion barrier layer is protected during processing, the choice of materials may be further relaxed as long as the requirements (i) to act as a copper migration barrier and (ii) to recess selectively to a copper film are met.

While the uppermost portion of diffusion barrier layer 604 illustrated in an embodiment in FIG. 6A, is co-planar with the conductive fill layer, in other embodiments the uppermost portion of diffusion barrier layer 604 is either slightly above or slightly below the level of the conductive fill layer 606.

Figure 7A:
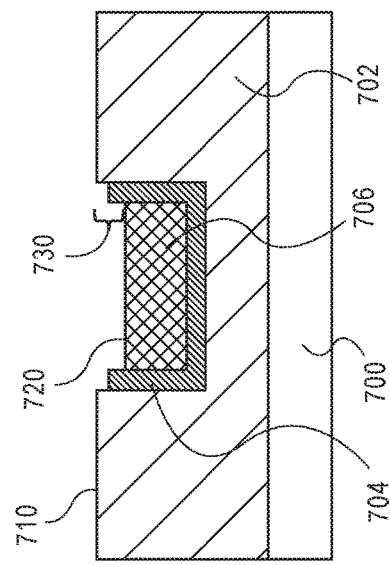
Figure 7B:
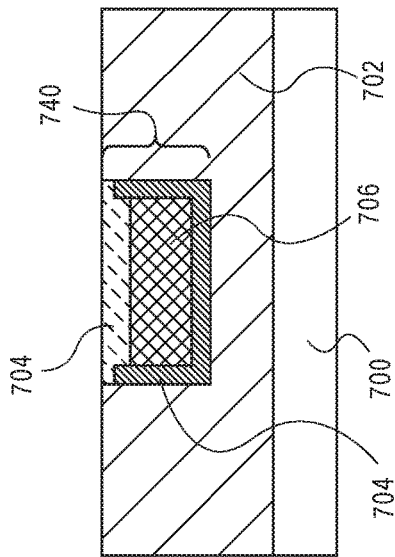

In accordance with the embodiments of the present invention, even with relative height differential between the diffusion barrier layer 604 and the conductive fill layer 606, the conductive capping layer 608 can still encapsulate both layers. With the structure of FIG. 4F as a starting point, FIG. 7A illustrates an embodiment wherein the uppermost surface of the diffusion barrier layer 704 is recessed part way between the uppermost surface 710 of dielectric 702 and the uppermost surface 720 of conductive fill layer 706 to form a T-shaped recess 730. The operational order of recessing diffusion barrier layer 704 and the conductive fill layer 706 as discussed in connection with FIG. 6A apply herein. In an embodiment, a 10 nm recess in the diffusion barrier layer, below the level of the uppermost surface of dielectric 702, can be controllably achieved via wet etch process. Furthermore, the profile of the uppermost portion of the diffusion barrier layer 704 is flat in one embodiment, but the uppermost portion of diffusion barrier layer 704 may also consist of a gradual taper in another embodiment. An interconnect structure 730 in FIG. 7B illustrates the structure of FIG. 7A following a fill and planarization of a conductive capping layer 704 that is disposed in the trench and on the surface of the dielectric layer 702. Conductive capping layer 708 encapsulates diffusion harrier layer 704 and conductive fill layer 706 and forms a T shaped pattern. In accordance with the present embodiment, the conductive capping layer thickness on diffusion barrier layer 704 is less than on conductive fill layer 706.

Figure 8A:
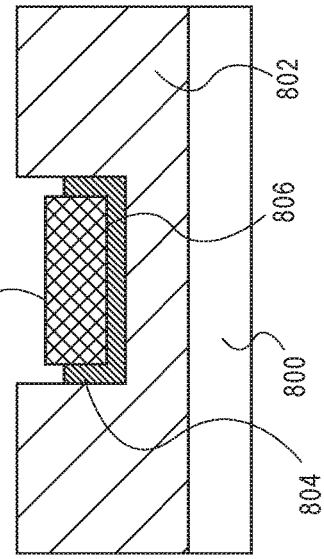
Figure 8B:
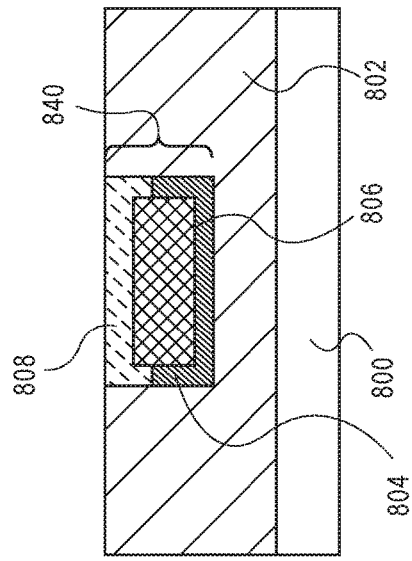

With the structure of FIG. 4F as a starting point, FIG. 8A illustrates an embodiment wherein the uppermost portion of the diffusion bather layer 804 is recessed below the uppermost surface 820 of conductive fill layer 806. In one embodiment a recess in the range of 10-20 nm in the diffusion barrier layer 802, below an uppermost surface 820 of conductive fill layer 806, can be controllably achieved via a wet etch process. An interconnect structure 840 in FIG. 8B illustrates the structure of FIG. 8A following a fill and polish of the conductive capping layer 808 that is disposed in the trench and on the surface of the dielectric layer 802. Conductive capping layer 808 encapsulates diffusion harrier layer 804 and conductive fill layer 806. In accordance with the present embodiment, the thickness of the conductive capping layer on diffusion harrier layer 804 is greater than on the conductive fill layer 806. The reverse is true in FIG. 7B.

Relating to one or more embodiments described herein, it is to be appreciated that traditional DRAM memory is facing severe scaling issues and, so, other types of memory devices are being actively explored in the electronics industry. One future contender is MRAM devices. Embodiments described herein include a fabrication method for embedding MRAM memory element into a logic transistor via a novel conductive interconnect capping scheme. Embodiments described may be advantageous for processing schemes involving the fabrication of logic processors with embedded memory arrays.

Figure 10:
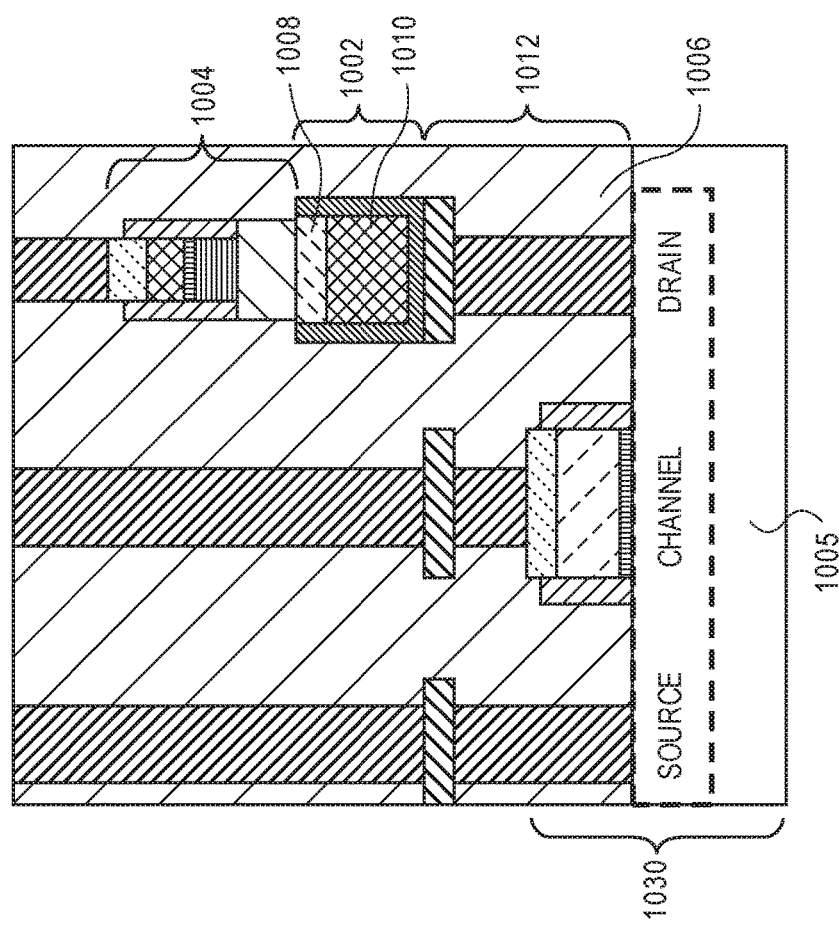
FIG. 10 illustrates a memory structure integrated onto the drain end of a logic transistor, in accordance with an embodiment of the present invention.

While the conductive interconnect described in connection with FIG. 1A is disposed in a trench, in other embodiments described in connection with FIG. 3C, a conductive interconnect may be included in a via structure. FIG. 10 illustrates a memory element 1004, formed on a conductive interconnect 1002 disposed in a via and integrated with a logic transistor 1030 disposed above a substrate 1005. In one such embodiment the memory element 1004 is formed on the conductive interconnect 1002 consisting of a conductive capping layer 1008 covering a conductive fill layer 1010. In one such embodiment, the conductive interconnect is disposed directly on a conductive contact structure 1012 connected to the drain end of the transistor.

In an embodiment, the underlying semiconductor substrate 1005 represents a general workpiece object used to manufacture integrated circuits. The semiconductor substrate often includes a wafer or other piece of silicon or another semiconductor material. Suitable semiconductor substrates include, but are nut limited to, single crystal silicon, polycrystalline silicon and silicon on insulator (SOI), as well as similar substrates formed of other semiconductor materials. The substrate may also include semiconductor materials, metals, dielectrics, dopants, and other materials commonly round in semiconductor substrates.

In an embodiment, transistors associated with substrate 1005 are metal-oxide-semiconductor field-effect transistors (MOSFET or simply MOS transistors), fabricated on the substrate 1005. In various implementations or the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, each MOS transistor 1030 of substrate 1005 includes a gate stack funned of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer of each MOS transistor of substrate 1005 is formed on the gate dielectric layer and may consist of at least one P-type work function metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. To further embodiments, the source and drain regions may be formed using one or more alternate semiconductor materials such as germanium or a group III-V material or alloy. And in further embodiments, one or more layers of metal and/or metal alloys may be used to form the source and drain regions.

Figure 11:
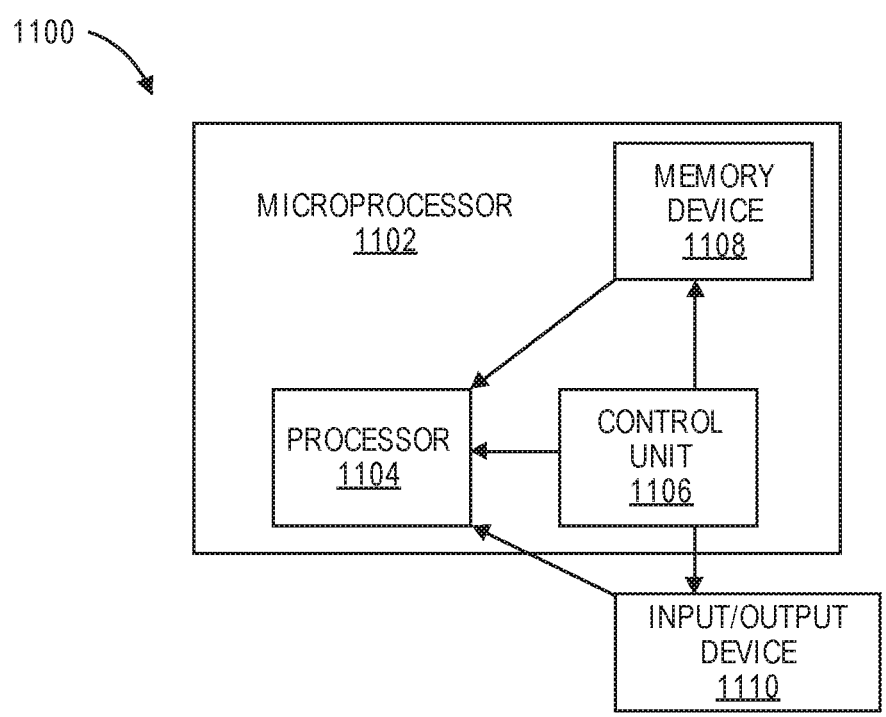
FIG. 11 illustrates a block diagram of an electronic system, in accordance with an embodiment of the present invention.

FIG. 11 illustrates as block diagram of an electronic system 1100, in accordance with an embodiment of the present invention. The electronic system 1100 can correspond to, for example, a portable system, a computer system, a process control system, or any other system that utilizes a processor and an associated memory. The electronic system 1100 may include a microprocessor 1102 (having a processor 1104 and control unit 1106), a memory device 1108, and an input/output device 1110 (it is to be understood that the electronic system 1100 may have a plurality of processors, control units, memory device units and/or input/output devices in various embodiments). In one embodiment, the electronic system 1100 has a set of instructions that define operations which are to be performed on data by the processor 1104, as well as, other transactions between the processor 1104, the memory device 1108, and the input/output device 1110. The control unit 1106 coordinates the operations or the processor 1104, the memory device 1108 and the input/output device 1110 by cycling through a set of operations that cause instructions to be retrieved from the memory device 1108 and executed. The memory device 1108 can include STT-MRAM memory arrays integrated into a logic processor, as described herein. In an embodiment, the memory device 1108 is embedded in the microprocessor 1102, as depicted in FIG. 11.

Figure 12:
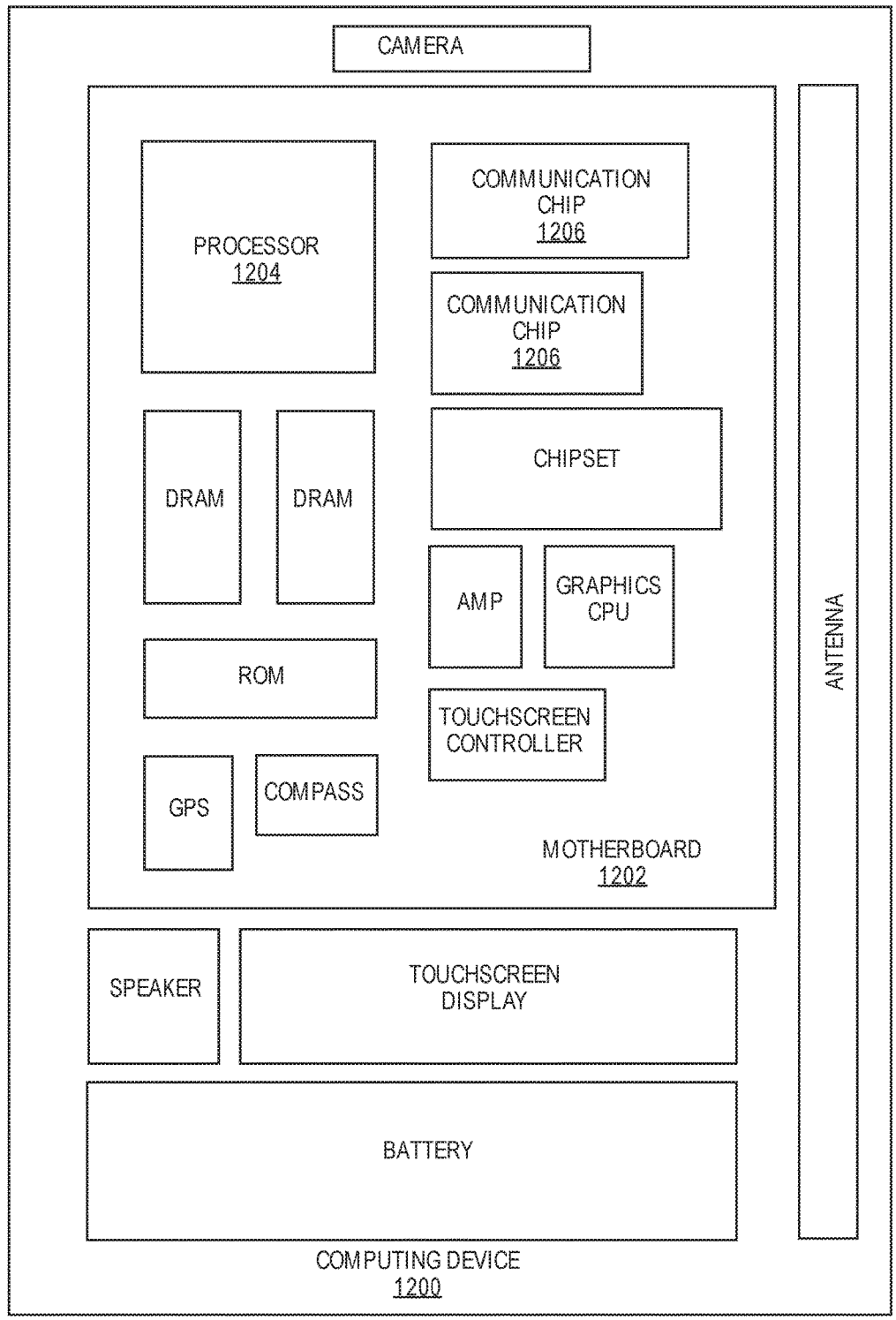
FIG. 12 illustrates a computing device in accordance with one embodiment of the invention.

FIG. 12 illustrates a computing device 1200 in accordance with one embodiment of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include ocher components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, lung term evolution (LTE), Ev-DO, HSPA+, HSDPA+, HSUPA+, EDGE, GSM, CPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGH, GPRS, CDMA, WiMAX, LTE, Ev-DO, and others.

The processor 1204 of the computing device 1200 includes an integrated circuit die packaged within the processor 1204. In some implementations of embodiments of the invention, the integrated circuit die of the processor includes one or mere arrays, such as STT-MRAM memory arrays integrated into a logic processor, built in accordance with embodiments of the present invention. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another implementation of an embodiment of the invention, the integrated circuit die of the communication chip includes STT-MRAM memory arrays integrated into a logic processor, built in accordance with embodiments of the present invention.

In further implementations, another component housed within the computing device 1200 may contain a stand-alone integrated circuit memory die that includes one or more arrays, such as STT-MRAM memory arrays integrated into a logic processor, built in accordance with embodiments of the present invention.

In various implementations, the computing device 1200 may be a laptop, a netbook, a notebook, an ultrabook, a smartphone, a tablet, a personal digital assistant (PDA), an ultra-mobile PC, a mobile phone, a desktop computer, a server, u printer, a scanner, a monitor, a set-top box, an entertainment control unit, a digital camera, a portable music player, or a digital video recorder. In further implementations, the computing device 1200 may be any other electronic device that processes data.

Accordingly, one or more embodiments of the present invention relate generally to the fabrication of embedded microelectronic memory. The microelectronic memory may be non-volatile, wherein the memory can retain stored information even when not powered. One or more embodiments of the present invention relate to the fabrication of STT-MRAM memory arrays integrated into a logic processor. Such arrays may be used in an embedded non-volatile memory, either for its non-volatility, or as a replacement for embedded dynamic random access memory (eDRAM). For example, such an array may be used for 1T-1X memory or 2T-1X memory (X=capacitor or resistor) at competitive cell sizes within a given technology node.

Figure 13:
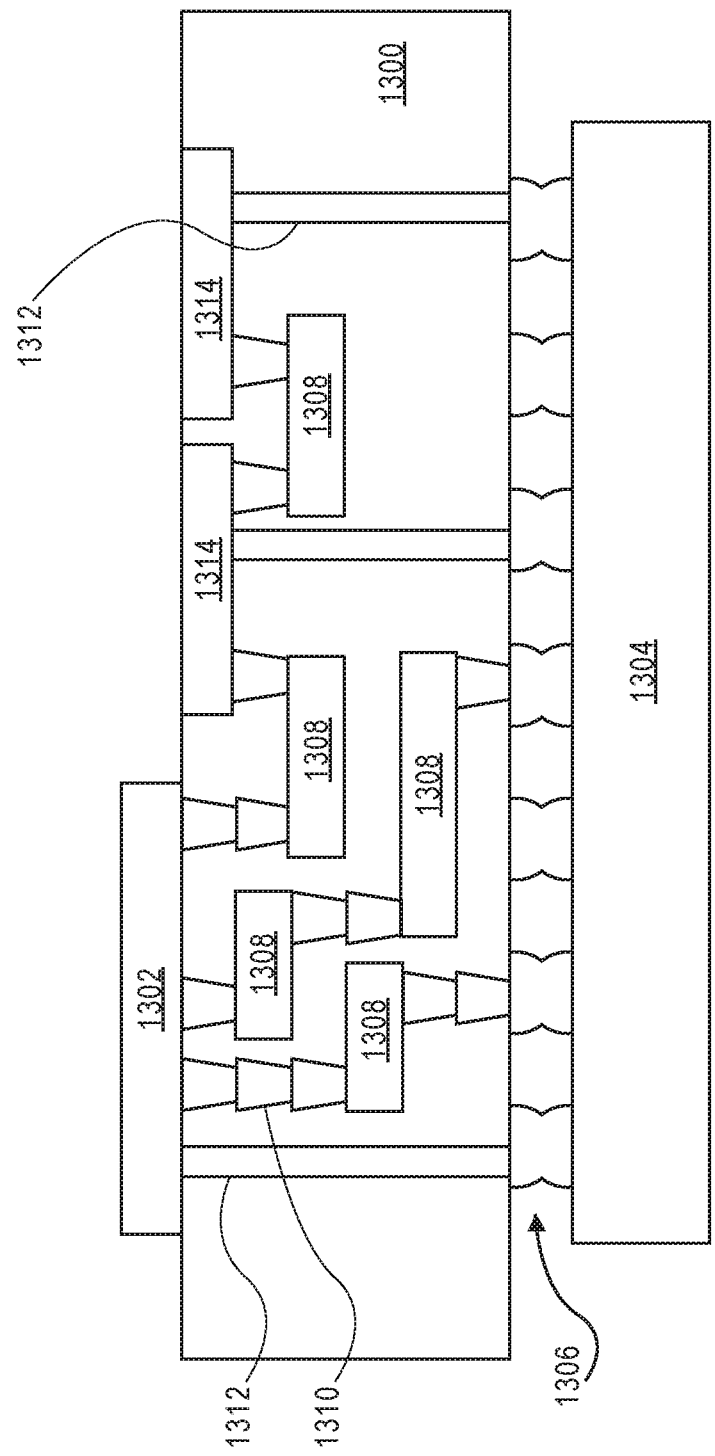
FIG. 13 illustrates an interposer that includes one or more embodiments of the invention.

FIG. 13 illustrates an interposer 1300 that includes one or more embodiments of the invention. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BOA) 1306 that can subsequently be coupled to the second substrate 1304. In some embodiments, the first and second substrates 1302/1304 tire attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with embodiments of the invention, apparatuses or processes disclosed herein may be used in the fabrication of interposer 1300.

Thus, embodiments described herein include, approaches for an interconnect cladding process for integrating magnetic random access memory (MRAM) devices, and the resulting structures.

In an embodiment, a memory structure includes an interconnect disposed in a trench of a dielectric layer above a substrate, the interconnect including a diffusion barrier layer disposed at a bottom of and along sidewalls of the trench to an uppermost surface of the dielectric layer, a conductive fill layer disposed on the diffusion barrier layer and recessed below the uppermost surface of the dielectric layer and an uppermost surface of the diffusion barrier layer, and a conductive capping layer disposed on the conductive fill layer and between sidewall portions of the diffusion barrier layer. A memory element is disposed on the conductive capping layer of the interconnect.

In one embodiment, an uppermost surface of the conductive capping layer is coplanar or substantially coplanar with the uppermost surface of the diffusion barrier layer and the uppermost surface of the dielectric layer.

In one embodiment, the conductive capping layer includes a material selected from the group consisting of tantalum, tantalum nitride, titanium and ruthenium.

In one embodiment, the diffusion harrier layer includes a material selected from the group consisting of cobalt, tantalum and ruthenium.

In one embodiment, the conductive fill material includes copper.

In one embodiment, an axis of symmetry of the memory element is offset from an axis of symmetry of the conductive interconnect.

In one embodiment, the memory element includes a conductive bottom electrode disposed on a portion of the conductive capping layer, a portion of the conductive diffusion barrier and a portion of the dielectric layer. A fixed magnetic layer is disposed on a portion of the conductive bottom electrode, a tunneling layer is disposed on the fixed magnetic layer, a free magnetic layer is disposed on the tunneling layer, a top electrode is disposed on the free magnetic layer, and a dielectric spacer surrounds the fixed magnetic layer, the tunneling layer, the free magnetic layer. The dielectric spacer extends from an upper surface of the bottom electrode to the top electrode.

In one embodiment, the top electrode layer and the conductive capping layer are a same material, the material selected from the group consisting of tantalum and tantalum nitride.

In an embodiment, a memory structure, includes an interconnect disposed in a trench of a dielectric layer above a substrate. The interconnect includes a diffusion barrier layer disposed at a bottom of and along sidewalls of a trench and recessed below an uppermost surface of the dielectric layer, a conductive fill layer disposed on the diffusion barrier layer and recessed below the uppermost surface of the dielectric layer, and a conductive capping layer disposed on the conductive fill layer, on the diffusion barrier layer and between sidewall portions of the dielectric layer. A memory element is disposed on the conductive capping layer of the interconnect.

In one embodiment, an uppermost surface of conductive capping layer is coplanar or substantially coplanar with the uppermost surface of the dielectric layer.

In one embodiment, an uppermost surface of the diffusion harrier layer is planar or substantially co-planar with an uppermost surface of the conductive fill layer.

In one embodiment, an uppermost surface of the diffusion barrier layer is recessed below an uppermost surface of the conductive fill layer.

In one embodiment, an uppermost surface of the diffusion harrier layer is above an uppermost surface of the conductive fill layer.

In one embodiment, the conductive capping layer includes a material selected from the group consisting of tantalum, tantalum nitride, titanium, tantalum, and ruthenium.

In one embodiment, the conductive diffusion barrier layer includes a material selected from the group consisting of cobalt, tantalum and ruthenium.

In one embodiment, the conductive fill material includes copper.

In one embodiment, an axis of symmetry of the memory device is offset from an axis of symmetry of the interconnect.

In one embodiment, the memory element includes a conductive bottom electrode disposed on a portion of the conductive capping layer and a portion of the dielectric layer, a fixed magnetic layer disposed on a portion of the conductive bottom electrode, a tunneling layer disposed directly on the fixed magnetic layer, a free magnetic layer disposed on the tunneling layer, a top electrode disposed on the free magnetic layer, and a dielectric spacer surrounding the fixed magnetic layer, the tunneling layer and the free magnetic layer. The dielectric spacer extends from an upper surface of the bottom electrode to the top electrode.

In one embodiment, the top electrode layer and the conductive capping layer are a same material, the material selected from the group consisting of tantalum and tantalum nitride.

In an embodiment, a method of fabricating a memory structure includes forming a trench in a dielectric layer above a substrate, forming a diffusion barrier along sidewalls and on a bottom of the trench, forming a conductive fill layer directly on the diffusion barrier layer in the trench, recessing the conductive fill layer below an uppermost surface of the dielectric layer, forming a conductive capping layer in the trench, directly on the conductive fill layer, and forming a memory element on the conductive capping layer.

In one embodiment, the recessing further includes recessing the diffusion barrier layer below the uppermost surface of the dielectric layer.

In one embodiment, the recessing further includes recessing the diffusion barrier layer above an uppermost surface of the conductive fill layer.

In one embodiment, the recessing further includes recessing the diffusion barrier below an uppermost surface of the conductive fill layer.

In one embodiment, forming the memory element includes plasma etching a top electrode disposed on a memory device, elements of the memory device, a dielectric spacer and a conductive bottom electrode, where a portion of the conductive capping layer is exposed to the plasma etching.

What is claimed is:

1. A memory structure, comprising:
   an interconnect disposed in a trench of a dielectric layer above a substrate, the interconnect comprising a diffusion barrier layer disposed at a bottom of and along sidewalls of the trench to an uppermost surface of the dielectric layer, a conductive fill layer disposed on the diffusion barrier layer and recessed below the uppermost surface of the dielectric layer and an uppermost surface of the diffusion barrier layer, and a conductive capping layer disposed on the conductive fill layer and between sidewall portions of the diffusion barrier layer; and
   a memory element disposed on the conductive capping layer of the interconnect.

2. The memory structure of claim 1, wherein an uppermost surface of the conductive capping layer is coplanar or substantially coplanar with the uppermost surface of the diffusion barrier layer and the uppermost surface of the dielectric layer.

3. The memory structure of claim 1, wherein the conductive capping layer comprises a material selected from the group consisting of tantalum, tantalum nitride, titanium and ruthenium.

4. The memory structure of claim 1, wherein the diffusion barrier layer comprises a material selected from the group consisting of cobalt, tantalum and ruthenium.

5. The memory structure of claim 1, wherein the conductive fill material comprises copper.

6. The memory structure of claim 1, wherein an axis of symmetry of the memory element is offset from an axis of symmetry of the conductive interconnect.

7. The memory structure of claim 1, wherein the memory element comprises:
   a conductive bottom electrode disposed on a portion of the conductive capping layer, a portion of the conductive diffusion barrier and a portion of the dielectric layer;
   a fixed magnetic layer disposed on a portion of the conductive bottom electrode;
   a tunneling layer disposed on the fixed magnetic layer;
   a free magnetic layer disposed on the tunneling layer;
   a top electrode disposed on the free magnetic layer; and
   a dielectric spacer surrounding the fixed magnetic layer, the tunneling layer, the free magnetic layer, the dielectric spacer extending from an upper surface of the bottom electrode to the top electrode.

8. The memory structure of claim 7, wherein the top electrode layer and the conductive capping layer are a same material, the material selected from the group consisting of tantalum and tantalum nitride.

9. A memory structure, comprising:
   an interconnect disposed in a trench of a dielectric layer above a substrate, the interconnect comprising a diffusion barrier layer disposed at a bottom of and along sidewalls of a trench and recessed below all uppermost surface of the dielectric layer, a conductive fill layer disposed on the diffusion harrier layer and recessed below the uppermost surface of the dielectric layer, and a conductive capping layer disposed on the conductive fill layer, on the diffusion barrier layer and between sidewall portions of the dielectric layer; and
   a memory element disposed on the conductive capping layer of the interconnect.

10. The memory structure of claim 9, wherein an uppermost surface of conductive capping layer is coplanar or substantially coplanar with the uppermost surface of the dielectric layer.

11. The memory structure of claim 9, wherein an uppermost surface of the diffusion barrier layer is planar or substantially co-planar with an uppermost surface of the conductive fill layer.

12. The memory structure of claim 9, wherein an uppermost surface of the diffusion barrier layer is recessed below an uppermost surface of the conductive fill layer.

13. The memory structure of claim 9, wherein an uppermost surface of the diffusion barrier layer is above an uppermost surface of the conductive fill layer.

14. The memory structure of claim 9, wherein the conductive capping layer comprises a material selected from the group consisting of tantalum, tantalum nitride, titanium, tantalum, and ruthenium.

15. The memory structure of claim 9, wherein the conductive diffusion barrier layer comprises a material selected from the group consisting of cobalt, tantalum and ruthenium.

16. The memory structure of claim 9, wherein the conductive fill material comprises copper.

17. The memory structure of claim 9, wherein an axis of symmetry of the memory device is offset from an axis of symmetry of the interconnect.

18. The memory structure of claim 9, wherein the memory element comprises:
   a conductive bottom electrode disposed on a portion of the conductive capping layer and a portion of the dielectric layer;
   a fixed magnetic layer disposed on a portion of the conductive bottom electrode;
   a tunneling layer disposed directly on the fixed magnetic layer;
   a free magnetic layer disposed on the tunneling layer;
   a top electrode disposed on the free magnetic layer; and
   a dielectric spacer surrounding the fixed magnetic layer, the tunneling layer and the free magnetic layer, the dielectric spacer extending from an upper surface of the bottom electrode to the top electrode.

19. The memory structure of claim 9, wherein the top electrode layer and the conductive capping layer are a same material, the material selected from the group consisting of tantalum and tantalum nitride.

20. A method of fabricating a memory structure, the method comprising:
   forming a trench in a dielectric layer above a substrate;
   forming a diffusion barrier along sidewalls and on a bottom of the trench;
   forming a conductive fill layer directly on the diffusion barrier layer in the trench;
   recessing the conductive fill layer below an uppermost surface of the dielectric layer;
   forming a conductive capping layer in the trench, directly on the conductive fill layer; and
   forming a memory element on the conductive capping layer.

21. The method of claim 20, wherein the recessing further comprises recessing the diffusion barrier layer below the uppermost surface of the dielectric layer, wherein the conductive capping layer is further formed over the diffusion barrier layer.

22. The method of claim 20, wherein forming the memory element comprises plasma etching a top electrode disposed on a memory device, elements of the memory device, a dielectric spacer and a conductive bottom electrode, wherein a portion of the conductive capping layer is exposed to the plasma etching.

23. The method of claim 21, wherein the recessing further comprises recessing the diffusion barrier layer above an uppermost surface of the conductive fill layer.

24. The method or claim 23, wherein the recessing further comprises recessing the diffusion barrier below an uppermost surface of the conductive fill layer.

* * * * *